(12) United States Patent
Tak et al.

(10) Patent No.: US 12,125,942 B2
(45) Date of Patent: Oct. 22, 2024

(54) SEMICONDUCTOR LIGHT EMITTING DEVICES

(71) Applicant: SAMSUNG ELECTRONICS CO., LTD., Suwon-si (KR)

(72) Inventors: Youngjo Tak, Seongnam-si (KR); Joosung Kim, Seongnam-si (KR); Jonguk Seo, Hwaseong-si (KR); Sungjin Ahn, Hwaseong-si (KR); Donggun Lee, Hwaseong-si (KR); Jeongwook Lee, Yongin-si (KR); Youngjin Choi, Seoul (KR); Yongseok Choi, Suwon-si (KR); Jonghoon Ha, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 253 days.

(21) Appl. No.: 17/352,708

(22) Filed: Jun. 21, 2021

(65) Prior Publication Data
US 2021/0408327 A1      Dec. 30, 2021

(30) Foreign Application Priority Data

Jun. 24, 2020   (KR) .................. 10-2020-0077380

(51) Int. Cl.
*H01L 33/14*   (2010.01)
*H01L 33/38*   (2010.01)
*H01L 33/44*   (2010.01)

(52) U.S. Cl.
CPC ............ *H01L 33/14* (2013.01); *H01L 33/385* (2013.01); *H01L 33/44* (2013.01)

(58) Field of Classification Search
CPC ........ H01L 33/14; H01L 33/385; H01L 33/44
See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |
| RE38,466 E | 3/2004 | Inoue et al. |

(Continued)

OTHER PUBLICATIONS

Wong et al., "High efficiency of III-nitride micro-light-emitting diodes by sidewall passivation using atomic layer deposition," Optics Express 21324, vol. 26, No. 16, Aug. 6, 2018, (8 total pages).

(Continued)

*Primary Examiner* — Matthew C Landau
*Assistant Examiner* — Dmitriy Yemelyanov
(74) *Attorney, Agent, or Firm* — Sughrue Mion, PLLC

(57) ABSTRACT

A semiconductor light emitting device is provided. The device includes a light emitting structure stack including a first conductive semiconductor layer, a second conductive semiconductor layer, and an active layer arranged between the first conductive semiconductor layer and the second conductive semiconductor layer; a first electrode electrically connected to the first conductive semiconductor layer; a second electrode electrically connected to the second conductive semiconductor layer; and a field control structure on a sidewall of the light emitting structure stack, the field control structure including a field control electrode on a sidewall of the active layer; and a dielectric layer between the field control electrode and the active layer.

13 Claims, 24 Drawing Sheets

(56) References Cited

U.S. PATENT DOCUMENTS

| | | |
|---|---|---|
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,048,383 B2 | 6/2015 | Mayer et al. |
| 9,246,305 B1 | 1/2016 | Kub et al. |
| 9,450,147 B2 | 9/2016 | McGroddy et al. |
| 9,455,373 B2 | 9/2016 | Yokozeki et al. |
| 9,484,492 B2 | 11/2016 | Bour et al. |
| 10,418,519 B2 | 9/2019 | Bour et al. |
| 2002/0195606 A1* | 12/2002 | Edmond ............... B82Y 20/00 257/79 |
| 2018/0287027 A1* | 10/2018 | Chaji ................. H01L 33/0093 |
| 2018/0374994 A1 | 12/2018 | Ebbecke et al. |
| 2019/0157512 A1* | 5/2019 | Jung .................... H01L 25/167 |
| 2020/0044117 A1* | 2/2020 | Vierheilig ............. H01L 33/14 |

OTHER PUBLICATIONS

Kim et al., "Suppression of Leakage Current in InGaN/GaN Multiple-Quantum Well LEDs by N2O Plasma Treatment," ECS, Electrochemical and Solid-State Letters, 7 (11) G241-G243, Sep. 28, 2004 (3 pages).

Dingemans et al., "Status and prospects of Al2O3-based surface passivation schemes for silicon solar cells," TU/e, Eindhoven University of Technology, Jan. 1, 2012, (28 pages).

Zhao et al., "Enhanced Surface Passivation Effect in InGaN/GaN Disk-in-Nanowire Light Emitting Diodes for Mitigating Shockley-Read-Hall Recombination," RSC Publishing, Nonoscale, 00, 1-3, 2015, (8 pages).

* cited by examiner

SEMICONDUCTOR LIGHT EMITTING DEVICES

CROSS-REFERENCE TO THE RELATED APPLICATION

This application claims priority to Korean Patent Application No. 10-2020-0077380, filed on Jun. 24, 2020, in the Korean Intellectual Property Office, the disclosure of which is incorporated herein by reference in its entirety.

BACKGROUND

1. Field

Methods, apparatuses and systems consistent with example embodiments to a semiconductor light emitting device, and more particularly, to a semiconductor light emitting device having a micrometer size or a sub-micrometer size.

2. Related Art

The semiconductor light emitting device is widely used as a light source for a display device as well as a light source for a lighting device. In recent years, as the application of semiconductor light emitting devices has expanded, the development of semiconductor light emitting devices having a micrometer size or sub-micrometer size is needed. However, as the size of a semiconductor light emitting device decreases, there is a problem in that the luminous efficiency thereof decreases.

SUMMARY

Example embodiments provide a semiconductor light emitting device having excellent luminous efficiency even if the semiconductor light emitting device has a small size such as a micrometer size.

According to an aspect of an example embodiment, there is provided a semiconductor light emitting device including: a light emitting structure stack including a first conductive semiconductor layer, a second conductive semiconductor layer, and an active layer arranged between the first conductive semiconductor layer and the second conductive semiconductor layer; a first electrode electrically connected to the first conductive semiconductor layer; a second electrode electrically connected to the second conductive semiconductor layer; and a field control structure on a sidewall of the light emitting structure stack, the field control structure including a field control electrode on a sidewall of the active layer; and a dielectric layer between the field control electrode and the active layer.

According to an aspect of an example embodiment, there is provided a semiconductor light emitting device including: a light emitting structure stack including a first conductive semiconductor layer, a second conductive semiconductor layer, and an active layer arranged between the first conductive semiconductor layer and the second conductive semiconductor layer; a first electrode on a bottom surface of the first conductive semiconductor layer; a second electrode on an upper surface of the second conductive semiconductor layer; and a field control structure on a sidewall of the light emitting structure stack. The field control structure includes a field control electrode on a sidewall of the active layer and a sidewall of the second conductive semiconductor layer, and electrically connected to the second electrode; and a dielectric layer between the field control electrode and the active layer and between the field control electrode and the second conductive semiconductor layer.

According to another aspect of the inventive concept, there is provided a semiconductor light emitting device including: a light emitting structure stack including a first conductive semiconductor layer, a second conductive semiconductor layer, and an active layer arranged between the first conductive semiconductor layer and the second conductive semiconductor layer; a first electrode on a bottom surface of the first conductive semiconductor layer; a second electrode on an upper surface of the second conductive semiconductor layer; and a field control structure surrounding a sidewall of the light emitting structure stack, which including a dielectric layer on the sidewall of the light emitting structure stack; and a field control electrode surrounding the sidewall of the active layer, wherein the dielectric layer is between the active layer and the field control electrode and is spaced apart from the first electrode and the second electrode.

BRIEF DESCRIPTION OF THE DRAWINGS

The above and other objects and features will become more apparent from the following description of example embodiments with reference to the accompanying drawings in which.

DETAILED DESCRIPTION

Figure 1:
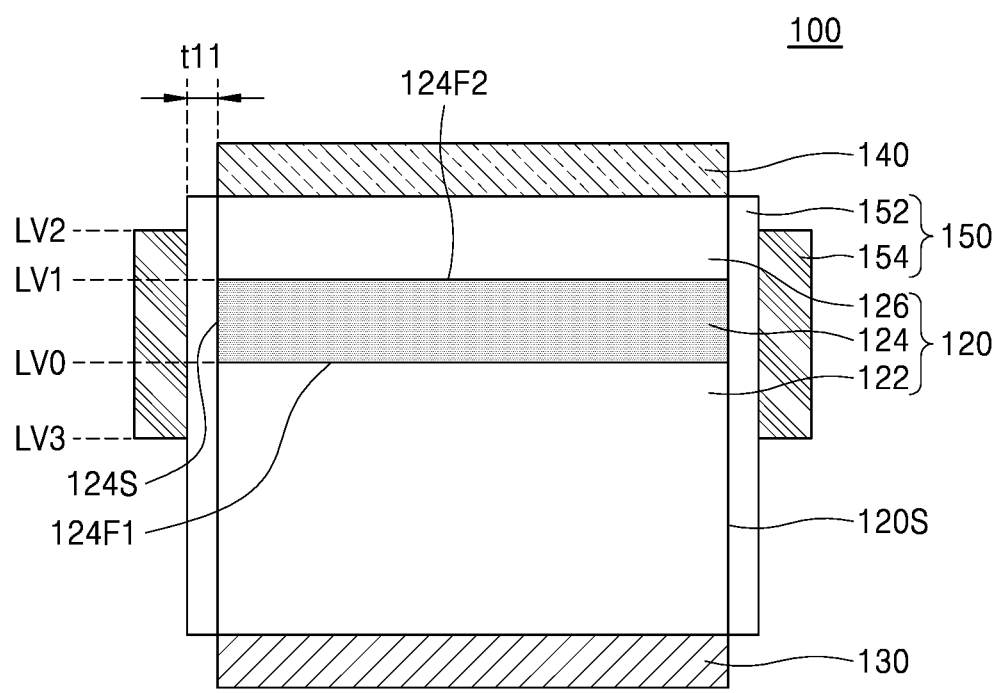
FIG. 1 is a cross-sectional view of a semiconductor light emitting device according to example embodiments.

Example embodiments will now be described more fully with reference to the accompanying drawings. Throughout the present specification, the same reference numerals are used to indicate the same elements.

FIG. 1 is a cross-sectional view of a semiconductor light emitting device 100 according to example embodiments.

Referring to FIG. 1, the semiconductor light emitting device 100 may include a light emitting structure stack 120, a first electrode 130, a second electrode 140, and a field control structure 150.

The light emitting structure stack 120 may include a first conductive semiconductor layer 122, an active layer 124, and a second conductive semiconductor layer 126. As shown in FIG. 1, the first conductive semiconductor layer 122 and the second conductive semiconductor layer 126 may be stacked with the active layer 124 therebetween.

The active layer 124 has a first surface 124F1 and a second surface 124F2 opposite to each other, the first surface 124F1 of the active layer 124 contacts the first conductive semiconductor layer 122, and the second surface 124F2 of the active layer 124 contacts the second conductive semiconductor layer 126. For convenience, a surface of the first conductive semiconductor layer 122 in contact with the first surface 124F1 of the active layer 124 is referred to as an upper surface of the first conductive semiconductor layer 122, and a surface of the first conductive semiconductor layer 122 opposite to the upper surface is referred to as a bottom surface of the first conductive semiconductor layer 122. Also, for convenience, a surface of the second conductive semiconductor layer 126 in contact with the second surface 124F2 of the active layer 124 is referred to as a bottom surface of the second conductive semiconductor layer 126, and a surface of the second conductive semiconductor layer 126 opposite to the bottom surface is referred to as an upper surface of the second conductive semiconductor layer 126.

In addition, a bottom surface of the light emitting structure stack 120 is used to indicate the bottom surface of the first conductive semiconductor layer 122, and an upper surface of the light emitting structure stack 120 is used to indicate the upper surface of the second conductive semiconductor layer 126. In addition, the active layer 124 and the second conductive semiconductor layer 126 are sequentially arranged in a first direction perpendicular to the upper surface of the first conductive semiconductor layer 122.

A sidewall 120S of the light emitting structure stack 120 may include a sidewall of the first conductive semiconductor layer 122, a sidewall 124S of the active layer 124, and a sidewall of the second conductive semiconductor layer 126. A width of the light emitting structure stack 120 in a second direction parallel to the upper surface of the first conductive semiconductor layer 122 may be about 50 nm to about 100 µm. For example, the width of the light emitting structure stack 120 in the second direction parallel to the upper surface of the first conductive semiconductor layer 122 may be about 50 µm or less. When the width of the light emitting structure stack 120 is about 100 µm or less, or about 50 µm or less, a ratio of a surface area of the active layer 124 to the total area of the active layer 124 may be relatively large, and in this case, a decrease in luminous efficiency due to non-radiative recombination, caused by surface defects, may be a problem.

The sidewall 120S of the light emitting structure stack 120 may be arranged perpendicular to the upper surface of the first conductive semiconductor layer 122, or may be arranged to be inclined with a certain inclination angle with respect to the upper surface of the first conductive semiconductor layer 122. For example, the sidewall 120S of the light emitting structure stack 120 may be inclined such that a width in a horizontal direction of the first conductive semiconductor layer 122 is greater than the width in the horizontal direction of the second conductive semiconductor layer 126, or may be inclined such that the width in the horizontal direction of the first conductive semiconductor layer 122 is less than the width in the horizontal direction of the second conductive semiconductor layer 126. The sidewall 120S of the light emitting structure stack 120 may be formed by etching the first conductive semiconductor layer 122, the active layer 124, and the second conductive semiconductor layer 126 that are sequentially stacked.

The first conductive semiconductor layer 122 may be a nitride semiconductor, for example, satisfying n-type $In_xAl_yGa_{1-x-y}N$ ($0 \leq x<1$, $0 \leq y<1$, and $0 \leq x+y<1$), and for example, an n-type impurity may be Si. For example, the first conductive semiconductor layer 122 may include n-type GaN.

In example embodiments, the first conductive semiconductor layer 122 may include a contact semiconductor layer and a current diffusion layer. For example, an impurity concentration of the contact semiconductor layer may be in a range of about $2 \times 10^{18}$ cm$^{-3}$ to about $9 \times 10^{19}$ cm$^{-3}$, and a thickness of the contact semiconductor layer may be about 1 µm to about 5 µm. The current diffusion layer may have a structure in which a plurality of $In_xAl_yGa_{(1-x-y)}N$ ($0 \leq x$, $y \leq 1$, and $0 \leq x+y \leq 1$) layers having different compositions or different impurity contents are repeatedly stacked. For example, the current diffusion layer may be an n-type superlattice layer in which two or more layers of different compositions, for example, made of an n-type GaN layer and/or $Al_xIn_yGa_zN$ ($0 \leq x$, $y$, $z \leq 1$, except $x=y=z=0$), are repeatedly stacked, and each layer has a thickness of about 1 nm to about 500 nm. An impurity concentration of the current diffusion layer may be $2 \times 10^{18}$ cm$^{-3}$ to $9 \times 10^{19}$ cm$^{-3}$. If necessary, the current diffusion layer may further include an insulating material layer.

In example embodiments, the second conductive semiconductor layer 126 may be a nitride semiconductor layer, such as, satisfying a p-type $In_xAl_yGa_{1-x-y}N$ ($0 \leq x \leq 1$, $0 \leq y \leq 1$, and $0 \leq x+y \leq 1$), and a p-type impurity may be Mg. For example, the second conductive semiconductor layer 126 may have a single layer structure. In other example embodiments, the second conductive semiconductor layer 126 may have a multilayer structure having different compositions. For example, the second conductive semiconductor layer 126 may include an electron blocking layer (EBL), a low-concentration p-type semiconductor layer, and a high-concentration p-type semiconductor layer that are sequentially stacked in the first direction. For example, the EBL may have a structure in which a plurality of different compositions of $In_xAl_yGa_{(1-x-y)}N$ each having a thickness of about 5 nm to about 100 nm are stacked, or may be a single $Al_yGa_{(1-y)}N$ layer. An energy band gap Eg of the EBL may decrease as the distance from the active layer 124 increases. For example, the Al composition of the EBL may decrease as the distance from the active layer 124 increases.

In example embodiments, the active layer 124 may have a multiple quantum well (MQW) structure in which a quantum well layer and a quantum barrier layer are alternately stacked with each other. For example, the quantum well layer and the quantum barrier layer may be $In_xAl_yGa_{1-x-y}N$ ($0 \leq x \leq 1$, $0 \leq y \leq 1$, and $0 \leq x+y \leq 1$) having different compositions. In some example embodiments, the quantum well layer may be $In_xGa_{1-x}N$ ($0 < x \leq 1$), and the quantum barrier layer may be GaN or AlGaN. The quantum well layer and the quantum barrier layer may each have a thickness in a range of about 1 nm to about 50 nm. In other example embodiments, the active layer 124 may have a single quantum well structure.

The first electrode 130 may be on the bottom surface of the light emitting structure stack 120 to be connected to the first conductive semiconductor layer 122. For example, the first electrode 130 may be arranged to contact the bottom surface of the first conductive semiconductor layer 122. In example embodiments, the first electrode 130 may include a material such as Ag, Ni, Al, Cr, Rh, Pd, Ir, Ru, Mg, Zn, Pt, and Au, and may include a single layer or two or more layers. In other example embodiments, an ohmic contact layer may be further arranged between the first electrode 130 and the first conductive semiconductor layer 122. The ohmic contact layer may include a metal such as Ag, Au, and Al, and a transparent conductive oxide such as indium tin oxide (ITO), zinc-doped indium tin oxide (ZITO), zinc indium oxide (ZIO), gallium indium oxide (GIO), zinc tin oxide (ZTO), aluminum-doped zinc oxide (AZO), gallium-doped zinc oxide (GZO), $In_4Sn_3O_{12}$, and zinc magnesium oxide ($Zn_{(1-x)}Mg_xO$, $0 \leq x \leq 1$). In other example embodiments, the ohmic contact layer may include graphene.

The second electrode 140 may be on an upper surface of the light emitting structure stack 120 to be connected to the second conductive semiconductor layer 126. For example, the second electrode 140 may be arranged to contact the upper surface of the second conductive semiconductor layer 126. In example embodiments, the second electrode 140 may include a material such as Ag, Ni, Al, Cr, Rh, Pd, Ir, Ru, Mg, Zn, Pt, and Au, and include a single layer or two or more layers. In other example embodiments, an ohmic contact layer may be further arranged between the second electrode 140 and the second conductive semiconductor layer 126. The ohmic contact layer may include a metal such as Ag, Au, and Al, and a transparent conductive oxide such as ITO, ZITO, ZIO, GIO, ZTO, AZO, GZO, $In_4Sn_3O_{12}$, and $Zn_{(1-x)}Mg_xO$ ($0 \leq x \leq 1$).

The field control structure 150 may be arranged on the sidewall 120S of the light emitting structure stack 120. The field control structure 150 may include a dielectric layer 152 and a field control electrode 154.

In example embodiments, the dielectric layer 152 may entirely surround the sidewall 120S of the light emitting structure stack 120. The dielectric layer 152 may include at least one of silicon oxide ($SiO_x$), silicon oxynitride, silicon nitride ($SiN_x$), magnesium oxide, aluminum oxide, aluminum oxynitride, aluminum gallium oxide, gallium oxide, aluminum nitride, hafnium oxide, and hafnium silicate (Hf-$SiO_x$). For example, the dielectric layer 152 may have a first thickness t11 in a range of about 10 nm to about 500 nm.

The field control electrode 154 may be on the dielectric layer 152 to surround the sidewall 124S of the active layer 124. The field control electrode 154 may surround and entirely cover a sidewall 124S of the active layer 124, a portion of the sidewall of the first conductive semiconductor layer 122 adjacent thereto, and a portion of the sidewall of the second conductive semiconductor layer 126.

As shown in FIG. 1, when the first surface 124F1 of the active layer 124 is defined as a reference level LV0, the second surface 124F2 of the active layer 124 may be at a first vertical level LV1 higher than the reference level LV0, and an upper surface of the field control electrode 154 may be at a second vertical level LV2 higher than the reference level LV0 and the first vertical level LV1. In addition, a bottom surface of the field control electrode 154 may be at a third vertical level LV3 lower than the reference level LV0. Accordingly, the sidewall 124S of the active layer 124 may be entirely surrounded and entirely covered by the field control electrode 154. In addition, the field control electrode 154 may be at a different vertical level from the first electrode 130 and the second electrode 140, and may be arranged apart from the first electrode 130 and the second electrode 140.

In example embodiments, the field control electrode 154 may include a metal material such as Ag, Ni, Al, Cr, Rh, Pd, Ir, Ru, Mg, Zn, Pt, and Au or a transparent conductive oxide such as ITO, ZITO, ZIO, GIO, ZTO, AZO, GZO, $In_4Sn_3O_{12}$, and $Zn_{(1-x)}Mg_xO$ ($0 \leq x \leq 1$).

In example embodiments, the field control structure 150 may reduce or prevent a decrease in luminous efficiency due to non-radiative recombination that may occur in a portion of the active layer 124 adjacent to the sidewall 120S of the light emitting structure stack 120. In general, the sidewall 124S of the active layer 124 may be damaged by an etching process, surface defects due to dangling bonds or impurities may be formed in the surface area of the active layer 124 adjacent to the sidewall 124S of the active layer 124, and non-radiative recombination may occur due to these surface defects. In particular, as the size of the light emitting structure stack 120 decreases, the ratio of a surface area of the active layer 124 to the total area of the active layer 124 increases, and thus, deterioration of luminous efficiency due to non-radiative recombination due to surface defects may increase.

According to example embodiments, the field control structure 150 may reduce an electron-hole recombination rate in a portion of the active layer 124 adjacent to the sidewall 120S of the light emitting structure stack 120 by causing imbalance between the concentration of a first carrier, which is a majority carrier, and the concentration of a second carrier, which is a minority carrier, in the portion of the active layer 124 adjacent to the sidewall 120S of the light emitting structure stack 120. The carrier concentration imbalance of the field control structure 150 will be described in detail with reference to FIG. 17.

Figure 17:
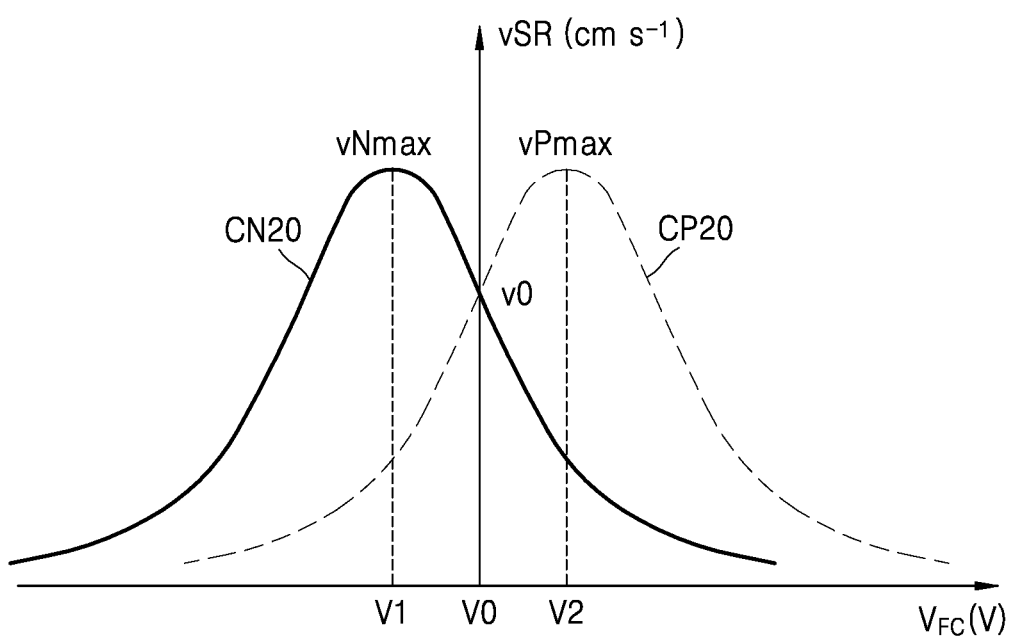
FIG. 17 is a graph showing a non-radiative recombination rate in an active layer according to application of a field control voltage.

FIG. 17 is a graph showing a non-radiative recombination rate in an active layer according to application of a field control voltage.

FIG. 17 illustrates a non-radiative recombination rate vSR (unit $cm \cdot s^{-1}$) of electron-hole recombination occurring in a portion of the active layer 124 adjacent to an interface between the dielectric layer 152 and the active layer 124, as a field control voltage $V_{FC}$ (unit V) is applied to the field control structure 150. A first graph CN20 corresponds to the non-radiative recombination rate vSR when the active layer 124 includes an n-type semiconductor layer, in which case the first or majority carrier is an electron, and the second or minority carrier is a hole. A second graph CP20 corresponds to the non-radiative recombination rate vSR when the active layer 124 includes a p-type semiconductor layer, in which case the first or majority carrier is a hole, and the second or minority carrier is an electron.

In the case of the first graph CN20 in which the active layer 124 includes an n-type semiconductor layer, the non-radiative recombination rate vSR at a reference voltage V0 is a first rate v0. The reference voltage V0 may be 0 V, and may correspond to a state in which no voltage is applied to the field control structure 150.

When the field control voltage $V_{FC}$ has a positive value and its magnitude increases (e.g., $V_{FC}>0$), an energy band of the surface area of the active layer 124 may bend due to a potential difference applied to the interface between the dielectric layer 152 and the active layer 124. For example, when the energy band is bent downward at the interface of the active layer 124 and the dielectric layer 152, a conduction band approaches a Fermi level at the interface and a valence band may move away from the Fermi level, and accordingly, while electrons, which are majority carriers, accumulate at the interface, the concentration of holes, which are minority carriers, decreases at the interface. That is, a first carrier concentration or a majority carrier concentration is significantly greater than a second carrier concentration or a minority carrier concentration, and thus, carrier concentration imbalance may be caused. When the first carrier concentration is significantly greater than the second carrier concentration, the second carrier concentration may determine an electron-hole recombination rate, and accordingly, the electron-hole recombination rate may decrease.

Conversely, when the field control voltage $V_{FC}$ has a negative value and its magnitude increases (e.g., $V_{FC}<0$), the energy band of the surface area of the active layer 124 may be bent upward due a potential difference applied to the interface between the dielectric layer 152 and the active layer 124. For example, when the energy band is bent upward at the interface of the active layer 124 and the dielectric layer 152, as the conduction band moves away from the Fermi level at the interface and the valence band approaches the Fermi level, the concentration of electrons, which are majority carriers, decreases at the interface, while holes, which are minority carriers, accumulate at the interface, so that a difference between the concentration of electrons and the concentration of holes may be reduced. In particular, when the field control voltage $V_{FC}$ is a first voltage V1, a difference between the first carrier concentration and the second carrier concentration is the smallest (e.g., the first carrier concentration and the second carrier concentration have similar values), and an electron-hole recombination rate may have a first maximum rate vNmax.

When the field control voltage $V_{FC}$ is less than the first voltage V1 (i.e., when the field control voltage $V_{FC}$ has a negative value and has a magnitude larger than the magnitude of the first voltage V1, for example, $V_{FC}<V1$), the energy band may be further upwardly bent at the interface of the active layer 124 and the dielectric layer 152, and while the concentration of electrons, which are majority carriers, is further reduced at the interface, holes, which are minority carriers, further accumulate at the interface, thereby causing carrier concentration imbalance again.

In summary, in the case of the first graph CN20 in which the active layer 124 includes an n-type semiconductor layer, when the field control voltage $V_{FC}$ is greater than the reference voltage V0 or less than the first voltage V1, imbalance between the first carrier concentration and the second carrier concentration may be caused, and thus, a non-radiative electron-hole recombination rate may be reduced.

In the case of the second graph CP20 in which the active layer 124 includes a p-type semiconductor layer, the non-radiative recombination rate vSR at the reference voltage V0 is the first rate v0. The reference voltage V0 may be 0 V, and may correspond to a state in which no voltage is applied to the field control structure 150.

When the field control voltage $V_{FC}$ has a negative value and its magnitude increases (i.e., when the field control voltage $V_{FC}$ decreases, e.g., $V_{FC}<0$), the energy band may be bent upward at the interface of the active layer 124 and the dielectric layer 152, and the valence band may approach the Fermi level and the conduction band may move away from the Fermi level at the interface, and accordingly, while holes, which are majority carriers, accumulate at the interface, the concentration of electrons, which are minority carriers, decreases at the interface. That is, carrier concentration imbalance in which the first carrier concentration is significantly greater than the second carrier concentration is caused, and thus, the electron-hole recombination rate may decrease.

Conversely, when the field control voltage $V_{FC}$ has a positive value and its magnitude increases (e.g., $V_{FC}>0$), while the concentration of holes, which are majority carriers, decreases at the interface, electrons, which are minority carriers, accumulate at the interface, so that a difference between the concentration of electrons and the concentration of holes may be reduced. (For example, $V_{FC}>0$) In particular, when the field control voltage $V_{FC}$ is a second voltage V2, a difference between the first carrier concentration and the second carrier concentration is the smallest (e.g., the first carrier concentration and the second carrier concentration have similar values), and an electron-hole recombination rate may have a second maximum rate vPmax.

When the field control voltage $V_{FC}$ is greater than the second voltage V2 (i.e., when the field control voltage $V_{FC}$ has a positive value and has a magnitude larger than the magnitude of the second voltage V2, for example, $V_{FC}>V2$), while the concentration of holes, which are majority carriers, is further reduced at the interface, electrons, which are minority carriers, further accumulate at the interface, thereby causing carrier concentration imbalance again.

In summary, in the case of the second graph CP20 in which the active layer 124 includes a p-type semiconductor layer, when the field control voltage $V_{FC}$ is less than the reference voltage V0 or greater than the second voltage V2, imbalance between the first carrier concentration and the second carrier concentration may be caused, and thus, a non-radiative electron-hole recombination rate may be reduced.

Referring back to FIG. 1, a field control voltage may be applied to the field control electrode 154. The field control voltage may be applied in an appropriate range to cause imbalance between the first carrier concentration and the second carrier concentration at the interface between the active layer 124 and the dielectric layer 152. For example, the field control voltage may vary depending on the conductivity of the active layer 124, the material of the dielectric layer 152, the thickness of the active layer 124, the ratio of the surface area of the active layer 124 to a total bulk area of the active layer 124, and the like.

According to the semiconductor light emitting device 100 according to example embodiments, carrier concentration imbalance of the active layer 124 is caused by the field control structure 150, and the semiconductor light emitting device 100 may have significantly improved luminous efficiency.

Figure 2:
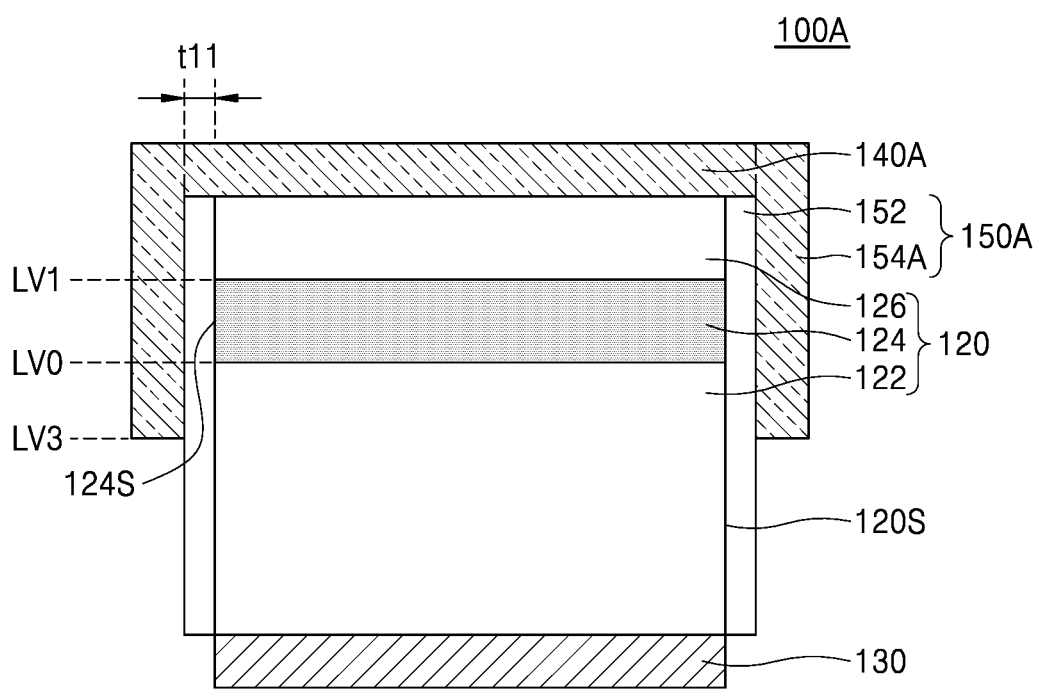
FIG. 2 is a cross-sectional view of a semiconductor light emitting device according to example embodiments.

FIG. 2 is a cross-sectional view of a semiconductor light emitting device 100A according to example embodiments. In FIG. 2, the same reference numerals discussed above with reference to FIG. 1 denote the same elements.

Referring to FIG. 2, a field control structure 150A may include the dielectric layer 152 which surrounds and entirely covers the sidewall 120S of the light emitting structure stack 120, and a field control electrode 154A which surrounds and entirely covers a sidewall 124S of the active layer 124 and a sidewall of the second conductive semiconductor layer 126 on the dielectric layer 152, and surrounds and partially covers a sidewall of the first conductive semiconductor layer 122.

In example embodiments, the field control electrode 154A may be connected to a second electrode 140A arranged on the second conductive semiconductor layer 126. For example, as shown in FIG. 2, the second electrode 140A may be formed on the entire upper surface of the light emitting structure stack 120, and the field control electrode 154A may surround and entirely cover both sidewalls 120S of the light emitting structure stack 120 and may be connected to the second electrode 140A, but are not limited thereto.

In example embodiments, the field control electrode 154A may be formed by using the same process as a forming process of the second electrode 140A or by using the same material as a forming material of the second electrode 140A, but is not limited thereto.

The field control electrode 154A may be electrically connected to the second electrode 140A, and accordingly, when an anode voltage is applied to the second electrode 140A, the field control voltage applied to the field control structure 150A may correspond to the anode voltage.

Figure 3:
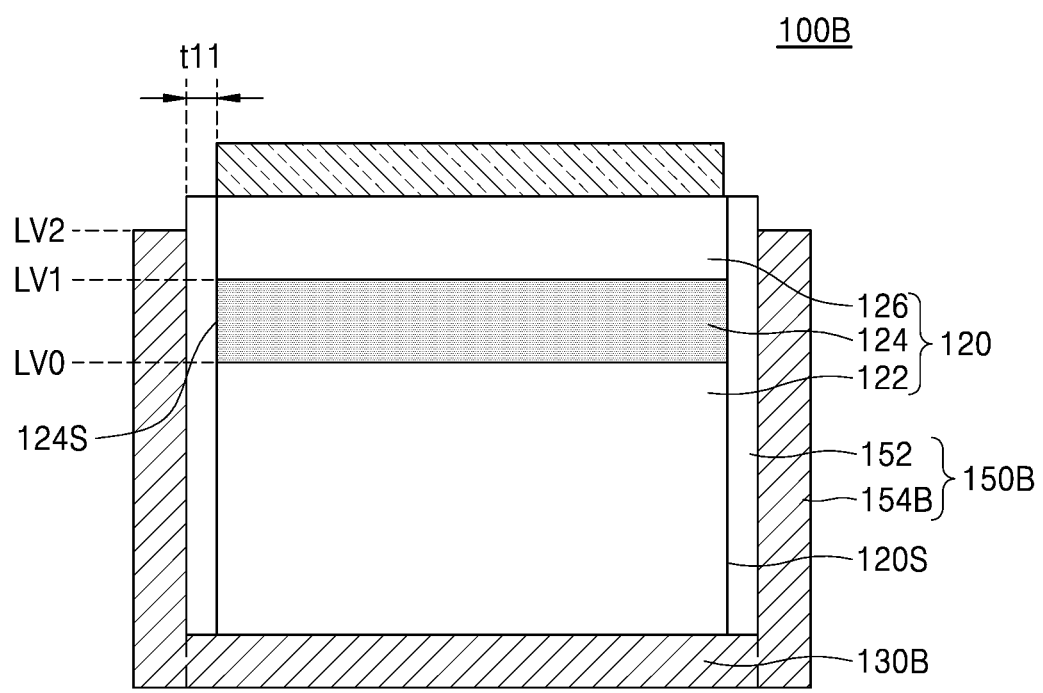
FIG. 3 is a cross-sectional view of a semiconductor light emitting device according to example embodiments.

FIG. 3 is a cross-sectional view of a semiconductor light emitting device 100B according to example embodiments. In FIG. 2, the same reference numerals discussed above with reference to FIGS. 1 and 2 denote the same elements.

Referring to FIG. 3, a field control structure 150B may include the dielectric layer 152 which surrounds and entirely covers the sidewall 120S of the light emitting structure stack 120, and a field control electrode 154B which surrounds and entirely covers the sidewall 124S of the active layer 124 and the sidewall of the first conductive semiconductor layer 122 on the dielectric layer 152, and partially covers a sidewall of the second conductive semiconductor layer 126.

In example embodiments, the field control electrode 154B may be connected to a first electrode 130B arranged on the first conductive semiconductor layer 122. For example, as shown in FIG. 3, the first electrode 130B may be formed on the entire upper surface of the light emitting structure stack 120, and the field control electrode 154B may surround and entirely cover both sidewalls 120S of the light emitting structure stack 120 and may be connected to the first electrode 130B, but are not limited thereto.

In example embodiments, the field control electrode 154B may be formed by using the same process as a forming process of the first electrode 130B or by using the same material as a forming material of the first electrode 130B, but is not limited thereto.

The field control electrode 154B may be electrically connected to the first electrode 130B, and accordingly, when a cathode voltage is applied to the first electrode 130B, the field control voltage applied to the field control structure 150B may correspond to the cathode voltage.

Figure 4:
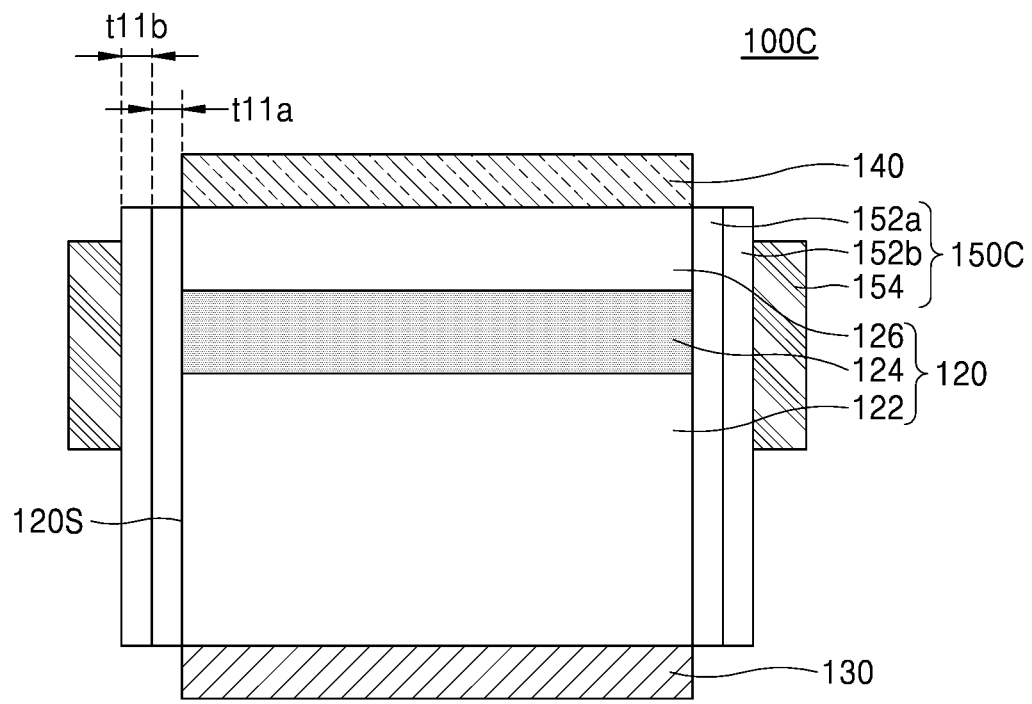
FIG. 4 is a cross-sectional view of a semiconductor light emitting device according to example embodiments.

FIG. 4 is a cross-sectional view of a semiconductor light emitting device 100C according to example embodiments. In FIG. 4, the same reference numerals discussed above with reference to FIGS. 1 to 3 denote the same elements.

Referring to FIG. 4, a field control structure 150C may include a first dielectric layer 152a, a second dielectric layer 152b, and the field control electrode 154. The first dielectric layer 152a may surround and entirely cover the sidewall 120S of the light emitting structure stack 120 and may have a first thickness t11a. The second dielectric layer 152b may be arranged on the first dielectric layer 152a to surround and entirely cover the sidewall 120S of the light emitting structure stack 120 and may have a second thickness t11b. For example, each of the first thickness t11a and the second thickness t11b may be in a range of about 10 nm to about 500 nm.

In example embodiments, each of the first dielectric layer 152a and the second dielectric layer 152b may include at least one of $SiO_x$, silicon oxynitride, $SiN_x$, magnesium oxide, aluminum oxide, aluminum oxynitride, aluminum gallium oxide, gallium oxide, aluminum nitride, hafnium oxide, and $HfSiO_x$, and the second dielectric layer 152b may include a material different from that of the first dielectric layer 152a.

In some examples, the first dielectric layer 152a may include silicon oxide and the second dielectric layer 152b may include aluminum oxide. In some examples, the first dielectric layer 152a may include silicon oxide, and the second dielectric layer 152b may include silicon nitride.

In some examples, the first dielectric layer 152a may include silicon oxide, and the second dielectric layer 152b may include silicon oxide doped with impurities. In some examples, the first dielectric layer 152a may include non-stoichiometric $SiO_x$, and the second dielectric layer 152b may include silicon dioxide ($SiO_2$). The non-stoichiometric silicon oxide may mean a $SiO_x$ in which the content of silicon versus the content of oxygen is not 1:2, and, for example, x may be greater than 0.5 and less than 2. In some examples, the first dielectric layer 152a may include silicon oxide to which an annealing treatment has been applied, and the second dielectric layer 152b may include silicon oxide to which an annealing treatment has not been applied.

In example embodiments, at least one of the first dielectric layer 152a and the second dielectric layer 152b may function as a fixed charge layer. In example embodiments, at least one of the first dielectric layer 152a and the second dielectric layer 152b may include a positive fixed charge or a negative fixed charge. In some example embodiments, at least one of the first dielectric layer 152a and the second dielectric layer 152b may have a total charge density greater than about 1E10 $cm^{-2}$. For example, at least one of the first dielectric layer 152a and the second dielectric layer 152b may have a total charge density greater than about 1E11 $cm^{-2}$, or greater than about 1E12 $cm^{-2}$. In some example embodiments, the total charge density of the first dielectric layer 152a may be different from the total charge density of the second dielectric layer 152b.

As at least one of the first dielectric layer 152a and the second dielectric layer 152b acts as a fixed charge layer, the field control electrode 154 may bend an energy band of the active layer 124 and at the same time help the fixed charge layer bend the energy band of the active layer 124. According to the semiconductor light emitting device 100C according to example embodiments, carrier concentration imbalance of the active layer 124 is caused by the field control structure 150C, and the semiconductor light emitting device 100C may have significantly improved luminous efficiency.

Figure 5:
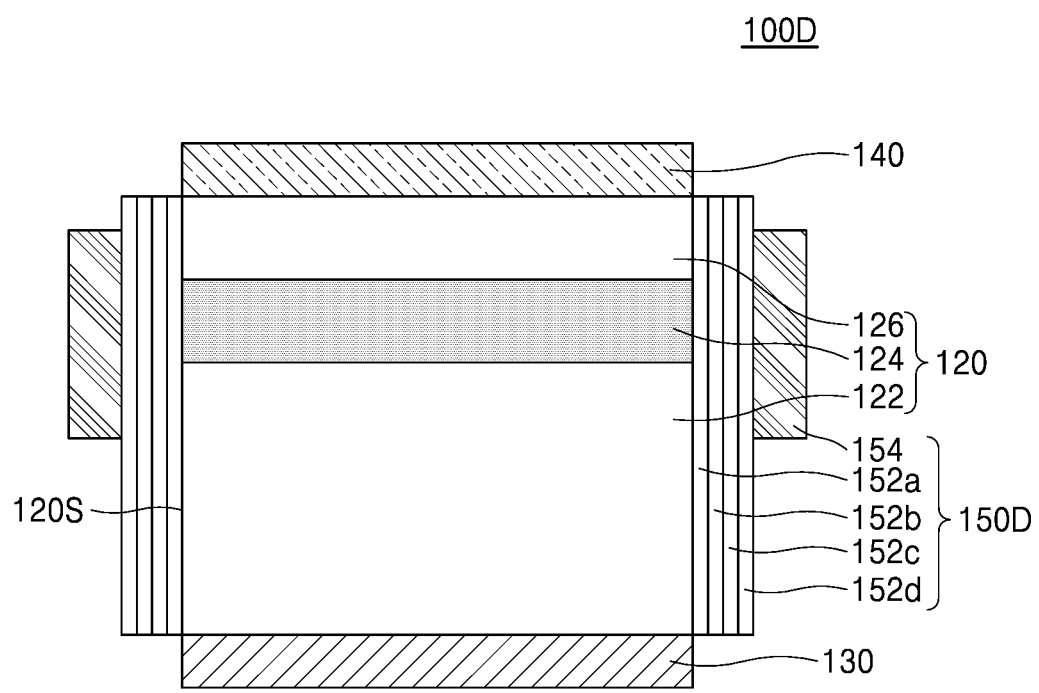
FIG. 5 is a cross-sectional view of a semiconductor light emitting device according to example embodiments.

FIG. 5 is a cross-sectional view of a semiconductor light emitting device 100D according to example embodiments. In FIG. 5, the same reference numerals discussed above with reference to FIGS. 1 to 4 denote the same elements.

A field control structure 150D may include the first dielectric layer 152a, the second dielectric layer 152b, a third dielectric layer 152c, a fourth dielectric layer 152d, and the field control electrode 154. Each of the first dielectric layer 152a, the second dielectric layer 152b, the third dielectric layer 152c, and the fourth dielectric layer 152d may include at least one of $SiO_x$, silicon oxynitride, $SiN_x$, magnesium oxide, aluminum oxide, aluminum oxynitride, aluminum gallium oxide, gallium oxide, aluminum nitride, hafnium oxide, and $HfSiO_x$. Each of the first dielectric layer 152a, the second dielectric layer 152b, the third dielectric layer 152c, and the fourth dielectric layer 152d may be in a range of about 10 nm to about 500 nm.

In example embodiments, at least one of the first dielectric layer 152a, the second dielectric layer 152b, the third dielectric layer 152c, and the fourth dielectric layer 152d may function as a fixed charge layer. In example embodiments, at least one of the first dielectric layer 152a, the second dielectric layer 152b, the third dielectric layer 152c, and the fourth dielectric layer 152d may include a positive fixed charge or a negative fixed charge. In some example embodiments, at least one of the first dielectric layer 152a, the second dielectric layer 152b, the third dielectric layer 152c, and the fourth dielectric layer 152d may have a total charge density greater than about $1E10$ $cm^{-2}$. For example, at least one of the first dielectric layer 152a, the second dielectric layer 152b, the third dielectric layer 152c, and the fourth dielectric layer 152d may have a total charge density greater than about $1E11$ $cm^{-2}$ or about $1E12$ $cm^{-2}$.

Figure 6:
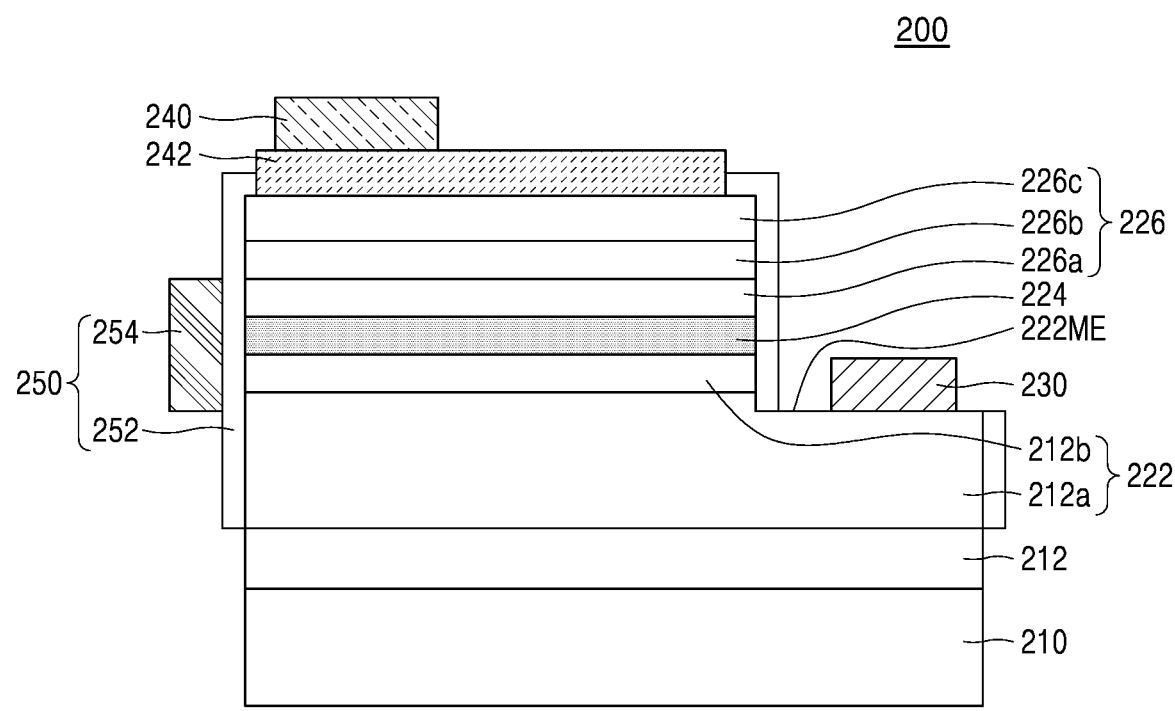
FIG. 6 is a cross-sectional view of a semiconductor light emitting device according to example embodiments.

FIG. 6 is a cross-sectional view of a semiconductor light emitting device 200 according to example embodiments. In FIG. 6, the same reference numerals discussed above with reference to FIGS. 1 to 5 denote the same elements.

Referring to FIG. 6, the semiconductor light emitting device 200 may include a substrate 210, a buffer layer 212 on the substrate 210, a first conductive semiconductor layer 222 on the buffer layer 212, an active layer 224, a second conductive semiconductor layer 226, a first electrode 230, a second electrode 240, and a field control structure 250.

The substrate 210 may be an insulating substrate such as sapphire. However, the disclosure is not limited thereto, and the substrate 210 may be a conductive or semiconductor substrate in addition to the insulating substrate. For example, the substrate 210 may be SiC, Si, $MgAl_2O_4$, MgO, $LiAlO_2$, $LiGaO_2$, and GaN in addition to sapphire.

The buffer layer 212 may be $In_xAl_yGa_{1-x-y}N$ ($0 \leq x \leq 1$ and $0 \leq y \leq 1$). For example, the buffer layer 212 may be GaN, AlN, AlGaN, or InGaN. In some example embodiments, as the buffer layer, a plurality of layers may be combined or the composition may be gradually changed to be used.

The first conductive semiconductor layer 222 may be a nitride semiconductor, such as, satisfying n-type $In_xAl_yGa_{1-x-y}N$ ($0 \leq x < 1$, $0 \leq y < 1$, and $0 \leq x+y < 1$), and for example, an n-type impurity may be Si. For example, the first conductive semiconductor layer 222 may include n-type GaN.

In example embodiments, the first conductive semiconductor layer 222 may include a contact semiconductor layer 222a on the buffer layer 212 and a current diffusion layer 222b on the contact semiconductor layer 222a. For example, an impurity concentration of the contact semiconductor layer 222a may be in a range of about $2 \times 10^{18}$ $cm^{-3}$ to about $9 \times 10^{19}$ $cm^{-3}$, and a thickness of the contact semiconductor layer 222a may be about 1 μm to about 5 μm. The current diffusion layer 222b may have a structure in which a plurality of $In_xAl_yGa_{(1-x-y)}N$ ($0 \leq x$, $y \leq 1$, and $0 \leq x+y \leq 1$) layers having different compositions or different impurity contents are repeatedly stacked. For example, the current diffusion layer 222b may be an n-type superlattice layer in which two or more layers of different compositions, for example, made of an n-type GaN layer and/or $Al_xIn_yGa_zN$ ($0 \leq x$, $y$, $z \leq 1$, except $x=y=z=0$), are repeatedly stacked, and each layer has a thickness of about 1 nm to about 500 nm. An impurity concentration of the current diffusion layer 222b may be $2 \times 10^{18}$ $cm^{-3}$ to $9 \times 10^{19}$ $cm^3$. If necessary, the current diffusion layer 222b may further include an insulating material layer.

In example embodiments, the second conductive semiconductor layer 226 may be a nitride semiconductor layer satisfying a p-type $In_xAl_yGa_{1-x-y}N$ ($0 \leq x < 1$, $0 \leq y < 1$, and $0 \leq x+y < 1$), and a p-type impurity may be Mg. The second conductive semiconductor layer 226 may include an EBL 226a, a low-concentration p-type semiconductor layer 226b, and a high-concentration p-type semiconductor layer 226c that are sequentially stacked in the first direction. For example, the EBL 226a may have a structure in which a plurality of different compositions of $In_xAl_yGa_{(1-x-y)}N$ are stacked, each having a thickness of about 5 nm to about 100 nm, or may be a single $Al_yGa_{(1-y)}N$ layer. The energy band gap Eg of the EBL 226a may decrease as the distance from the active layer 224 increases. For example, an Al composition of the EBL 226a may decrease as the distance from the active layer 224 increases.

In example embodiments, the active layer 224 may have a multiple quantum well (MQW) structure in which a quantum well layer and a quantum barrier layer are alternately stacked with each other. For example, the quantum well layer and the quantum barrier layer may be $In_xAl_yGa_{1-x-y}N$ ($0 \leq x \leq 1$, $0 \leq y \leq 1$, and $0 \leq x+y \leq 1$) having different compositions. In some example embodiments, the quantum well layer may be $In_xGa_{1-x}N$ ($0 < x \leq 1$), and the quantum barrier layer may be GaN or AlGaN. The quantum well layer and the quantum barrier layer may each have a thickness in a range of about 1 nm to about 50 nm. In other example embodiments, the active layer 124 may have a single quantum well structure.

The semiconductor light emitting device 200 may have a mesa etching structure in which the upper surface of the first conductive semiconductor layer 222 is exposed. For example, a stack structure of the first conductive semiconductor layer 222, the active layer 224, and the second conductive semiconductor layer 226 may be mesa etched, and the upper surface of the first conductive semiconductor layer 222 exposed at this time may be referred to as a mesa etching surface 222ME. The first electrode 230 may be arranged on the mesa etching surface 222ME of the first conductive semiconductor layer 222. For example, the first electrode 230 may be formed on an exposed surface of the contact semiconductor layer 222a, may include a material such as Ag, Ni, Al, Cr, Rh, Pd, Ir, Ru, Mg, Zn, Pt, Au, and the like, and may include a single layer or two or more layers.

An ohmic contact layer 242 may be on the second conductive semiconductor layer 226, and the second electrode 240 may be on the ohmic contact layer 242. In example embodiments, the ohmic contact layer 242 may include a metal such as Ag, Au, and Al, and a transparent conductive oxide such as ITO, ZITO, ZIO, GIO, ZTO, AZO, GZO, $In_4Sn_3O_{12}$, and $Zn_{(1-x)}Mg_xO$ ($0 \leq x < 1$). The second electrode 240 may include a material such as Ag, Ni, Al, Cr, Rh, Pd, Ir, Ru, Mg, Zn, Pt, and Au, and may be a single layer or two or more layers.

The field control structure 250 may include a dielectric layer 252 and a field control electrode 254. The dielectric layer 252 may surround and entirely cover sidewalls of the first conductive semiconductor layer 222, the active layer 224, and the second conductive semiconductor layer 226. The field control electrode 254 may be arranged on the dielectric layer 252 to partially surround the active layer 224, extend below the active layer 224 to at least partially cover the first conductive semiconductor layer 222 and extend above the active layer 224 to at least partially cover second conductive semiconductor layer 226.

As shown in FIG. 6, the dielectric layer 252 may not be formed on all of the mesa-etched surface 222ME of the first conductive semiconductor layer 222. In addition, the field control electrode 254 may not be arranged on a sidewall of a portion of the active layer 224 adjacent to the mesa etching surface 222ME of the first conductive semiconductor layer 222. The field control electrode 254 may be arranged to be apart from the first electrode 230 and the second electrode 240 and may be configured to apply a field control voltage independent of a cathode voltage or an anode voltage to a surface area of the active layer 224 arranged adjacent to the dielectric layer 252.

In FIG. 6, it is exemplarily shown that the dielectric layer 252 extends to a bottom surface of the first conductive semiconductor layer 222 and is not formed on a sidewall of the buffer layer 212. However, example embodiments are not limited thereto, and unlike FIG. 6, the dielectric layer 252 may extend to a level higher than the bottom surface of the first conductive semiconductor layer 222 with respect to an upper surface of the substrate 210 not to cover a lower portion of a sidewall of the first conductive semiconductor layer 222, or may extend to a level lower than the bottom surface of the first conductive semiconductor layer 222 with respect to the upper surface of the substrate 210 to cover a portion of the sidewall of the buffer layer 212.

Figure 7:
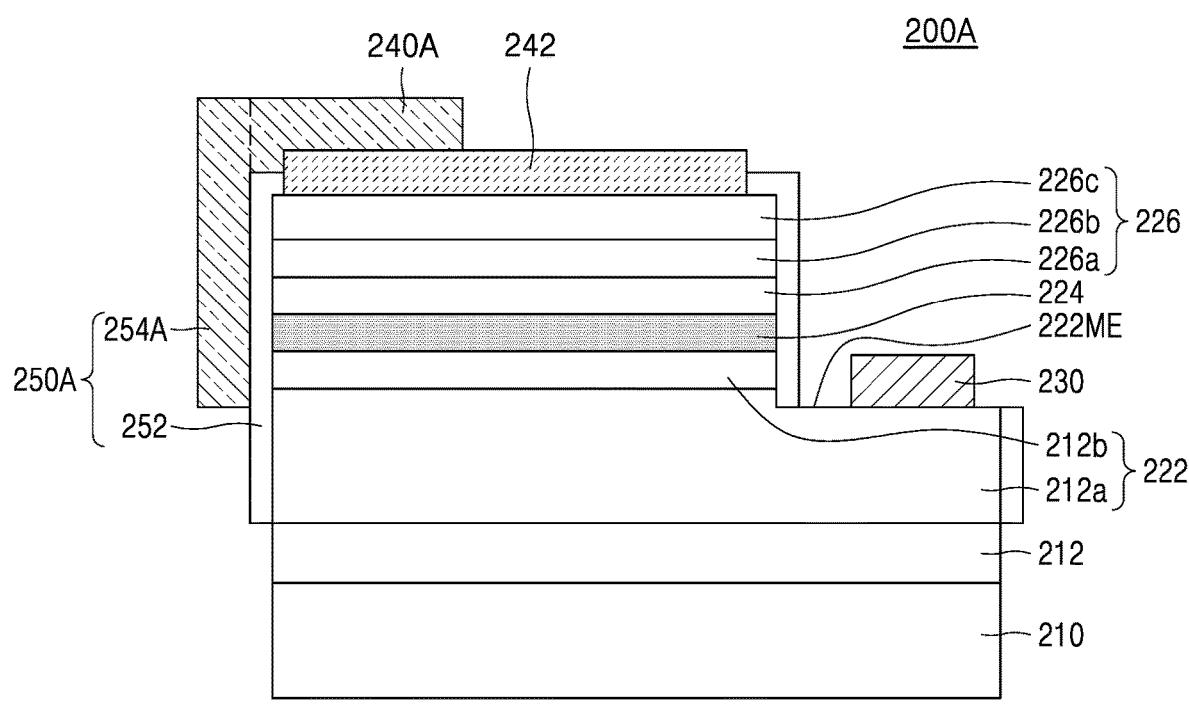
FIG. 7 is a cross-sectional view of a semiconductor light emitting device according to example embodiments.

FIG. 7 is a cross-sectional view of a semiconductor light emitting device 200A according to example embodiments. In FIG. 7, the same reference numerals discussed above with reference to FIGS. 1 to 6 denote the same elements.

Referring to FIG. 7, a field control structure 250A may include the dielectric layer 252, and a field control electrode 254A. The field control structure 250A may surround and entirely cover a sidewall of the active layer 224 and a sidewall of the second conductive semiconductor layer 226 on the dielectric layer 252. The field control electrode 254A may partially surround the sidewall of the active layer 224, and may extend below the active layer 224 to at least partially cover the first conductive semiconductor layer 222 and extend above an upper surface of the second conductive semiconductor layer 226.

In example embodiments, the field control electrode 254A may be connected to a second electrode 240A arranged on the second conductive semiconductor layer 226. For example, as shown in FIG. 7, the field control electrode 254A may extend to a level higher than an upper surface of the second conductive semiconductor layer 226 based on the upper surface of the substrate 210 and may be connected to the second electrode 240A, but is not limited thereto.

In example embodiments, the field control electrode 254A may be formed by using the same process as a forming process of the second electrode 240A or by using the same material as a forming material of the second electrode 240A, but is not limited thereto.

The field control electrode 254A may be electrically connected to the second electrode 240A, and accordingly, when an anode voltage is applied to the second electrode 240A, the field control voltage applied to the field control structure 250A may correspond to the anode voltage.

Figure 8:
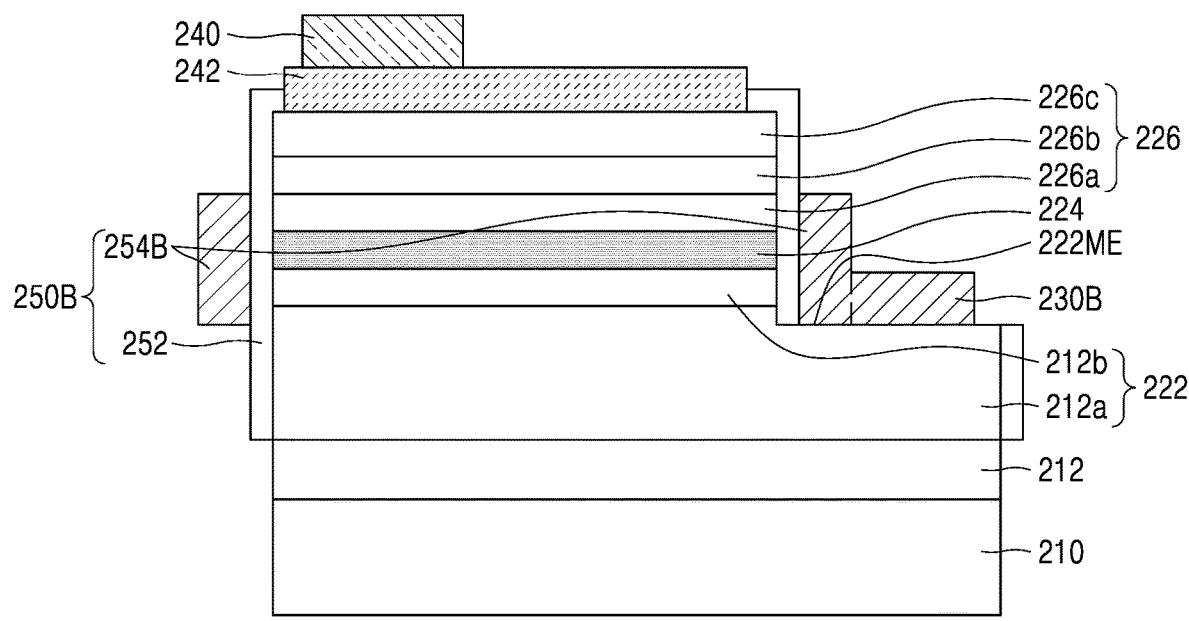
FIG. 8 is a cross-sectional view of a semiconductor light emitting device according to example embodiments.

FIG. 8 is a cross-sectional view of a semiconductor light emitting device 200B according to example embodiments. In FIG. 8, the same reference numerals discussed above with reference to FIGS. 1 to 7 denote the same elements.

Referring to FIG. 8, a field control structure 250B may include the dielectric layer 252 and a field control electrode 254B that surrounds and entirely covers a sidewall of the active layer 224 on the dielectric layer 252 and is connected to a first electrode 230B.

In example embodiments, the field control electrode 254B may be connected to the first electrode 230B arranged on the first conductive semiconductor layer 222. For example, as shown in FIG. 8, the field control electrode 254B may entirely surround and cover the sidewall of the active layer 224 including the sidewall of the portion of the active layer 224 adjacent to the mesa etching surface 222ME of the first conductive semiconductor layer 222. The first electrode 230B may be formed on the mesa etching surface 222ME of the first conductive semiconductor layer 222, and the field control electrode 254B may be connected to the first electrode 230B on the mesa etching surface 222ME.

In example embodiments, the field control electrode 254B may be formed by using the same process as a forming process of the first electrode 230B or by using the same material as a forming material of the first electrode 230B, but is not limited thereto.

The field control electrode 254B may be electrically connected to the first electrode 230B, and accordingly, when a cathode voltage is applied to the first electrode 230B, the field control voltage applied to the field control structure 250B may correspond to the cathode voltage.

Figure 9:
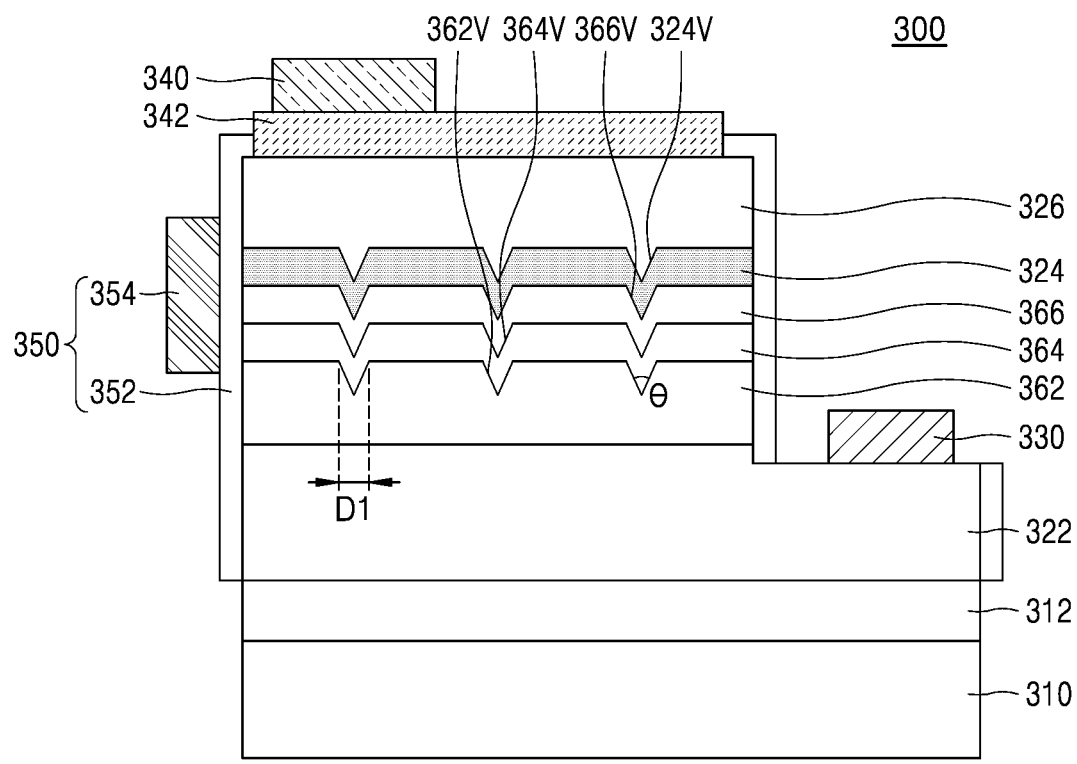
FIG. 9 is a cross-sectional view of a semiconductor light emitting device according to example embodiments.

FIG. 9 is a cross-sectional view of a semiconductor light emitting device 300 according to example embodiments. In FIG. 9, the same reference numerals discussed above with reference to FIGS. 1 to 8 denote the same elements.

Referring to FIG. 9, the semiconductor light emitting device 300 may include a substrate 310, a buffer layer 312, a first conductive semiconductor layer 322, an active layer 324, a second conductive semiconductor layer 326, a first electrode 330, a second electrode 340, an ohmic contact layer 342, and a field control structure 350, and may further include a V-pit formation layer 362, an intermediate semiconductor layer 364, and a superlattice layer 366 between the first conductive semiconductor layer 322 and the active layer 324.

The V-pit formation layer 362 is in contact with an upper surface of the first conductive semiconductor layer 322 and may include a plurality of V-pits 362V formed in an upper surface of the V-pit formation layer 362. A V-pit 362V may have a density of about $1\times10^8$ cm$^{-2}$ to about $5\times10^9$ cm$^{-2}$. In some examples, the V-pit formation layer 362 may have a thickness of about 200 nm to about 800 nm, and a width D1 of the entrance of the V-pit 362V may be about 200 nm to about 800 nm. The V-pit 362V may have a vertex angle θ of about 10 degrees to about 90 degrees, for example, about 20 degrees to about 80 degrees. For example, when the V-pit 362V is cut into a vertical plane passing through its vertex, an angle formed by two inclined planes meeting the vertical plane may be about 10 degrees to about 90 degrees. The V-pit 362V is formed around a threading dislocation penetrating a light emitting structure, so that a phenomenon in which current is concentrated at the threading dislocation may be prevented. In example embodiments, the V-pit formation layer 362 may include GaN or a GaN layer doped with impurities.

The intermediate semiconductor layer 364 may be on the V-pit formation layer 362. The intermediate semiconductor layer 364 is arranged to cover the V-pit 362V, and the intermediate semiconductor layer 364 may function as a film quality enhancing layer.

In some example embodiments, the intermediate semiconductor layer 364 may have a composition of $M_xGa_{1-x}N$, wherein M may be Al or In, and may satisfy $0.01 \leq x \leq 0.3$. In some example embodiments, 0.02≤x≤0.08. In other example embodiments, the intermediate semiconductor layer 364 may have a multilayer structure in which GaN layers and $M_xGa_{1-x}N$ layers (where M is Al or In, and 0.01≤x≤0.3) are alternately stacked. Optionally, the intermediate semiconductor layer 364 may be a superlattice layer of GaN and $M_xGa_{1-x}N$ (where M is Al or In, and 0.01≤x≤0.3). A thickness of the intermediate semiconductor layer 364 may be about 20 nm to about 100 nm.

The intermediate semiconductor layer 364 may be formed on the upper surface of the V-pit formation layer 362 to have a relatively constant thickness. A portion of the intermediate semiconductor layer 364 covers the V-pit 362V, and the portion of the intermediate semiconductor layer 364 may include a first pit portion 364V at a position corresponding to the V-pit 362V. The first pit portion 364V may have a dimension substantially similar to that of the V-pit 362V, but is not limited thereto.

The superlattice layer 366 may be on the intermediate semiconductor layer 364. The superlattice layer 366 may be formed on the intermediate semiconductor layer 364 to have a relatively constant thickness, and may cover the first pit portion 364V. The superlattice layer 366 may include a second pit portion 366V at a position corresponding to the first pit portion 364V. The superlattice layer 366 may have a structure in which a plurality of $In_xAl_yGa_{(1-y)}N$ layers (where 0≤x<1, 0≤y<1, and 0≤x+y<1) having different compositions or different impurity contents are repeatedly stacked. The superlattice layer 366 may promote diffusion of a current to enable uniform light emission over a relatively large area.

The active layer 324 may be on the superlattice layer 366. The active layer 324 may be formed to have a relatively constant thickness on the superlattice layer 366 and may cover the second pits 366V. The active layer 324 may include a third pit portion 324V at a position corresponding to the second pit portion 366V.

The field control structure 350 may include a dielectric layer 352 and a field control electrode 354. As exemplarily shown in FIG. 9, the dielectric layer 352 may cover sidewalls of the first conductive semiconductor layer 322, the V-pit formation layer 362, the intermediate semiconductor layer 364, the superlattice layer 366, the active layer 324, and the second conductive semiconductor layer 326. In other example embodiments, the dielectric layer 352 may cover only a sidewall of the active layer 324, a portion of a sidewall of the second conductive semiconductor layer 326 adjacent thereto, and a portion of a sidewall of the superlattice layer 366.

The field control electrode 354 may be arranged on the dielectric layer 352 to partially surround the active layer 324, extend below the active layer 324 to at least partially cover the portion of the sidewall of the superlattice layer 366 and extend above the active layer 324 to at least partially cover second conductive semiconductor layer 326. The field control electrode 354 may be arranged to be apart from the first electrode 330 and the second electrode 340 and may be configured to apply a field control voltage independent of a cathode voltage or an anode voltage to a surface area of the active layer 324 arranged adjacent to the dielectric layer 352.

Figure 10:
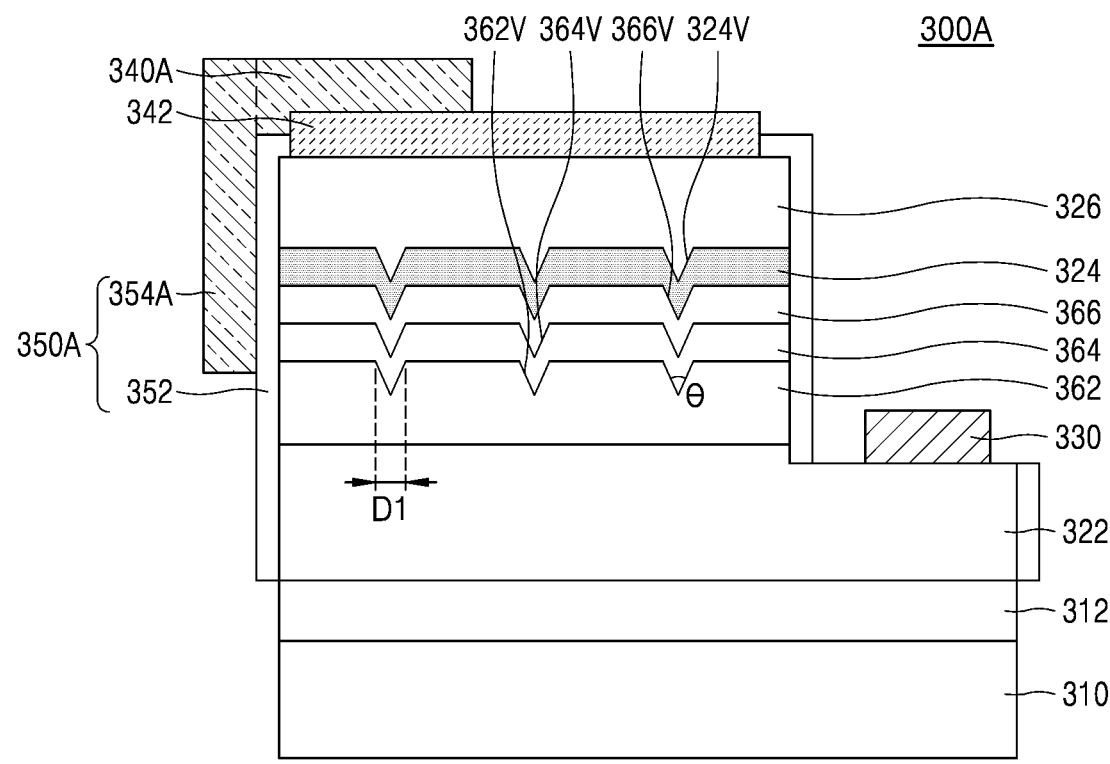
FIG. 10 is a cross-sectional view of a semiconductor light emitting device according to example embodiments.

FIG. 10 is a cross-sectional view of a semiconductor light emitting device 300A according to example embodiments. In FIG. 10, the same reference numerals discussed above with reference to FIGS. 1 to 9 denote the same elements.

Referring to FIG. 10, a field control structure 350A may include the dielectric layer 352, and a field control electrode 354A. The field control structure 350A may surround and entirely cover a sidewall of the active layer 324 and a sidewall of the second conductive semiconductor layer 326 on the dielectric layer 352. The field control electrode 354A may extend below the active layer 324 to at least partially cover the portion of the sidewall of the superlattice layer 366 and extend above the second conductive semiconductor layer 326.

The field control electrode 354A may be connected to a second electrode 340A arranged on the second conductive semiconductor layer 326. The field control electrode 354A may be formed by using the same process as a forming process of the second electrode 340A or by using the same material as a forming material of the second electrode 340A, but is not limited thereto. The field control electrode 354A may be electrically connected to the second electrode 340A, and accordingly, when an anode voltage is applied to the second electrode 340A, the field control voltage applied to the field control structure 350A may correspond to the anode voltage.

Figure 11:
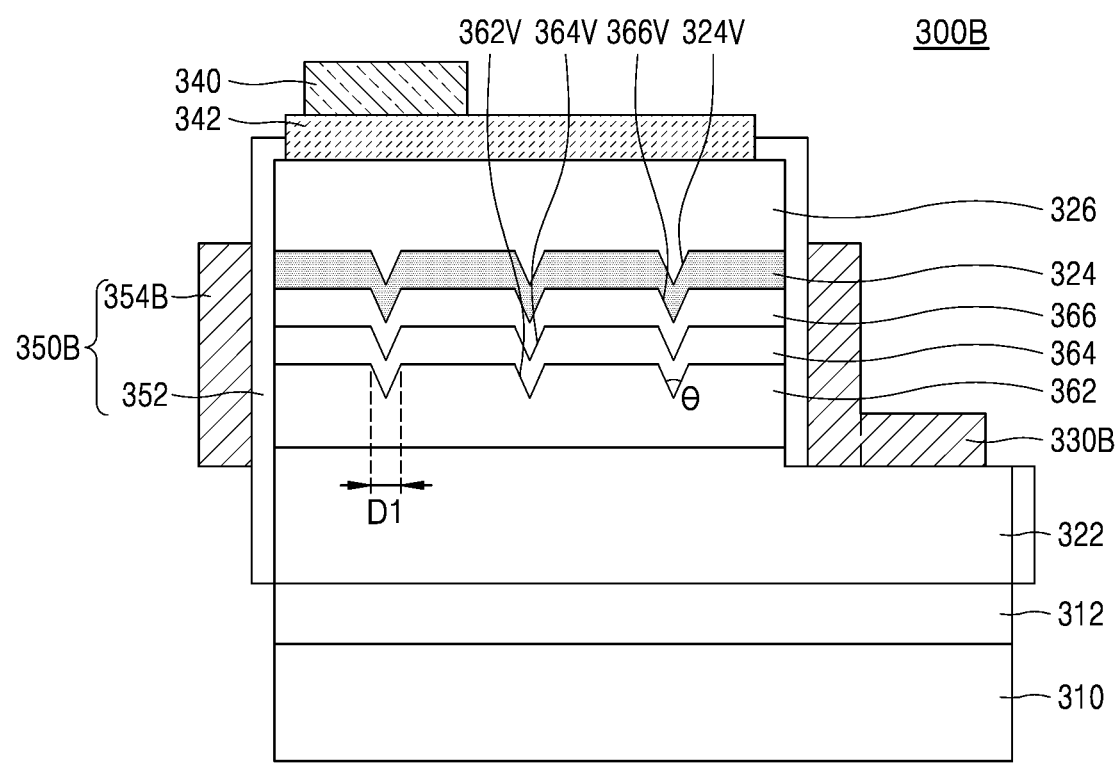
FIG. 11 is a cross-sectional view of a semiconductor light emitting device according to example embodiments.

FIG. 11 is a cross-sectional view of a semiconductor light emitting device 300B according to example embodiments. In FIG. 11, the same reference numerals discussed above with reference to FIGS. 1 to 10 denote the same elements.

Referring to FIG. 11, a field control structure 350B may include the dielectric layer 352 and a field control electrode 354B that surrounds and entirely covers a sidewall of the active layer 324 on the dielectric layer 352 and is connected to a first electrode 330B.

In example embodiments, the field control electrode 354B may be connected to the first electrode 330B arranged on the first conductive semiconductor layer 322. In example embodiments, the field control electrode 354B may be formed by using the same process as a forming process of the first electrode 330B or by using the same material as a forming material of the first electrode 330B, but is not limited thereto. The field control electrode 354B may be electrically connected to the first electrode 330B, and accordingly, when a cathode voltage is applied to the first electrode 330B, the field control voltage applied to the field control structure 350B may correspond to the cathode voltage.

Figure 12A:
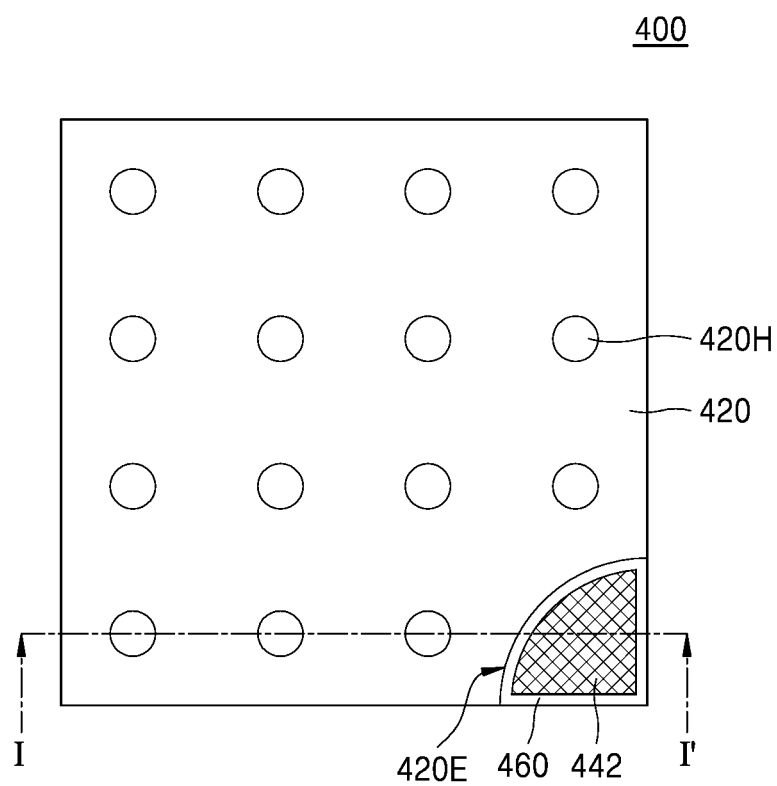
FIG. 12A is a top view of a semiconductor light emitting device according to example embodiments.
Figure 12B:
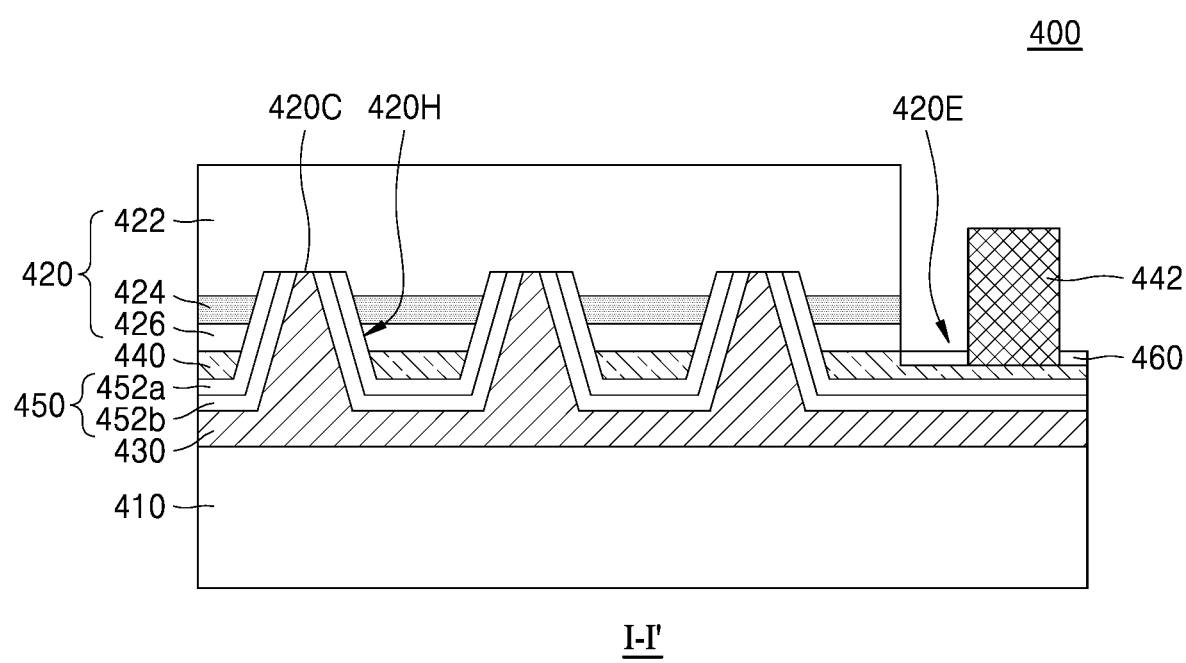
FIG. 12B is a cross-sectional view of the semiconductor light emitting device taken along line I-I' of FIG. 12A.

FIG. 12A is a top view of a semiconductor light emitting device 400 according to example embodiments, and FIG. 12B is a cross-sectional view of the semiconductor light emitting device 400 taken along line I-I' of FIG. 12A. In FIGS. 12A and 12B, the same reference numerals discussed above with reference to FIGS. 1 through 11 denote the same elements.

Referring to FIGS. 12A and 12B, the semiconductor light emitting device 400 may include a substrate 410, a light emitting structure stack 420, a first electrode 430, a second electrode 440, and a field control structure 450.

The light emitting structure stack 420 includes a first conductive semiconductor layer 422, an active layer 424, and a second conductive semiconductor layer 426, and the second electrode 440 may be on a bottom surface of the second conductive semiconductor layer 426. A plurality of contact holes 420H may pass through the second electrode 440, the second conductive semiconductor layer 426, and the active layer 424 and extend to the first conductive semiconductor layer 422.

The first electrode 430 is formed on the substrate 410 and extends into the plurality of contact holes 420H to be connected to the first conductive semiconductor layer 422. A portion of the first conductive semiconductor layer 422 exposed by the plurality of contact holes 420H may be referred to as a contact area 420C, and a portion of the first conductive semiconductor layer 422 may contact the first electrode 430 in the contact area 420C. The plurality of contact holes 420H may be formed using an etching process, for example, a reactive ion etching process.

The field control structure 450 may include a first dielectric layer 452a and a second dielectric layer 452b that are sequentially arranged on sidewalls of the plurality of contact holes 420H. The first dielectric layer 452a and the second dielectric layer 452b may be arranged to be surrounded by a sidewall of the active layer 424 exposed to inner walls of the plurality of contact holes 420H. The first dielectric layer 452a and the second dielectric layer 452b are arranged not only between the inner walls of the plurality of contact holes 420H but also between a bottom surface of the second electrode 440 and an upper surface of the first electrode 430 to electrically insulate the first electrode 430 from the second electrode 440 and the light emitting structure stack 420.

In example embodiments, each of the first dielectric layer 452a and the second dielectric layer 452b may include at least one of $SiO_x$, silicon oxynitride, $SiN_x$, magnesium oxide, aluminum oxide, aluminum oxynitride, aluminum gallium oxide, gallium oxide, aluminum nitride, hafnium oxide, and $HfSiO_x$, and the second dielectric layer 452b may include a material different from that of the first dielectric layer 452a. At least one of the first dielectric layer 452a and the second dielectric layer 452b may function as a fixed charge layer, and may help the fixed charge layer bend an energy band of the active layer 424.

An electrode formation region 420E may be provided on one side of the light emitting structure stack 420, and a portion of the second electrode 440 may extend to the electrode formation region 420E. An electrode pad 442 may be arranged on a portion of the second electrode 440 in the electrode formation region 420E, and a lower sidewall of the electrode pad 442 may be surrounded by an insulating layer 460.

According to example embodiments, the field control structure 450 including the first dielectric layer 452a and the second dielectric layer 452b may be on a sidewall of the active layer 424 exposed to an inner wall of the plurality of contact holes 420H. The field control structure 450 may act as a fixed charge layer to bend the energy band of the active layer 424, and accordingly, imbalance between the concentration of a first carrier (majority carrier) and the concentration of a second carrier (minority carrier) may be caused in a surface area of the active layer 424 adjacent to the interface between the field control structure 450 and the active layer 424. Accordingly, deterioration of luminous efficiency due to non-radiative electron-hole recombination may be reduced or prevented, and thus the semiconductor light emitting device 400 may have significantly improved luminous efficiency.

Figure 13:
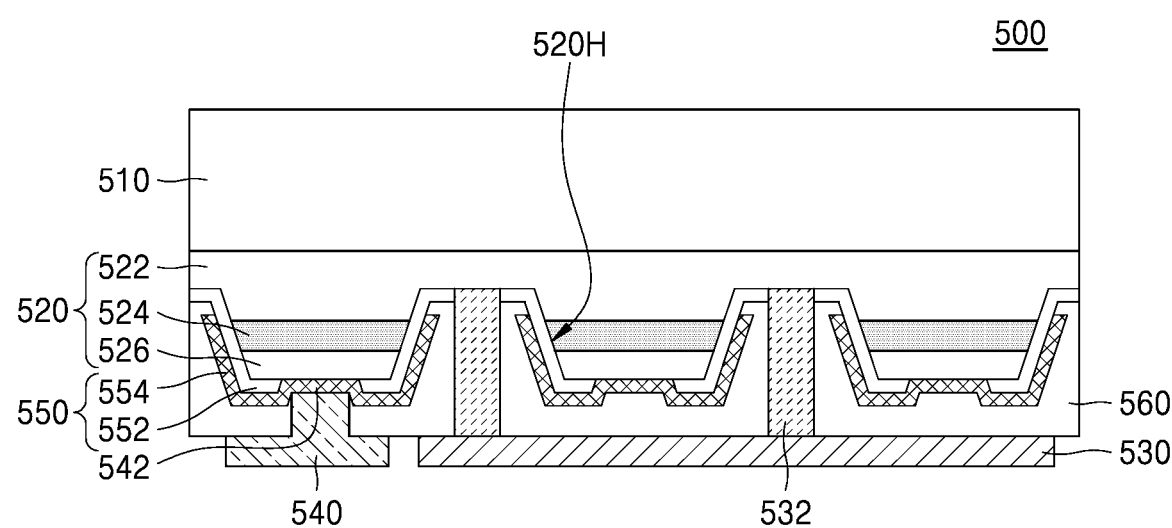
FIG. 13 is a cross-sectional view of a semiconductor light emitting device according to example embodiments.

FIG. 13 is a cross-sectional view of a semiconductor light emitting device 500 according to example embodiments. In FIG. 13, the same reference numerals discussed above with reference to FIGS. 1 to 12 denote the same elements.

The semiconductor light emitting device 500 may include a substrate 510, a light emitting structure stack 520, a first electrode 530, a second electrode 540, and a field control structure 550. The light emitting structure stack 520 may include a first conductive semiconductor layer 522, an active layer 524, and a second conductive semiconductor layer 526 that are sequentially arranged on the substrate 510. A plurality of contact holes 520H may pass through the active layer 524 and the second conductive semiconductor layer 526, and a portion of a surface of the first conductive semiconductor layer 522 may be exposed by the plurality of contact holes 520H.

The first electrode 530 may be connected to the portion of the surface of the first conductive semiconductor layer 522 exposed by the plurality of contact holes 520H by a first connection electrode portion 532. The second electrode 540 may be connected to the second conductive semiconductor layer 526 by a second connection electrode portion 542.

The field control structure 550 may include a dielectric layer 552 and a field control electrode 554. The dielectric layer 552 may be conformally arranged on an inner wall of the plurality of contact holes 520H and on the light emitting structure stack 520. However, the dielectric layer 552 may not be formed in a contact area between the first connection electrode portion 532 and the first conductive semiconductor layer 522, and in a contact area between the second connection electrode portion 542 and the second conductive semiconductor layer 526. The field control electrode 554 may be arranged to surround and entirely cover a sidewall of the active layer 524 arranged adjacent to the inner wall of the plurality of contact holes 520H, and the dielectric layer 552 may be between the sidewall of the active layer 524 and the field control electrode 554. The field control electrode 554 may extend along the inner wall of the plurality of contact holes 520H to be connected to the second connection electrode portion 542.

In example embodiments, the field control electrode 554 may be formed by using the same process as a forming process of the second connection electrode portion 542 or by using the same material as a forming material of the second connection electrode portion 542, but is not limited thereto.

An insulating layer 560 may fill an inner space of the plurality of contact holes 520H on the field control structure 550 and may surround the first connection electrode portion 532. The first electrode 530 and the second electrode 540 may be formed on the insulating layer 560 to be apart from each other at the same vertical level, and accordingly, the semiconductor light emitting device 500 may be mounted on a lead frame or a printed circuit board in a flip chip method.

Figure 14A:
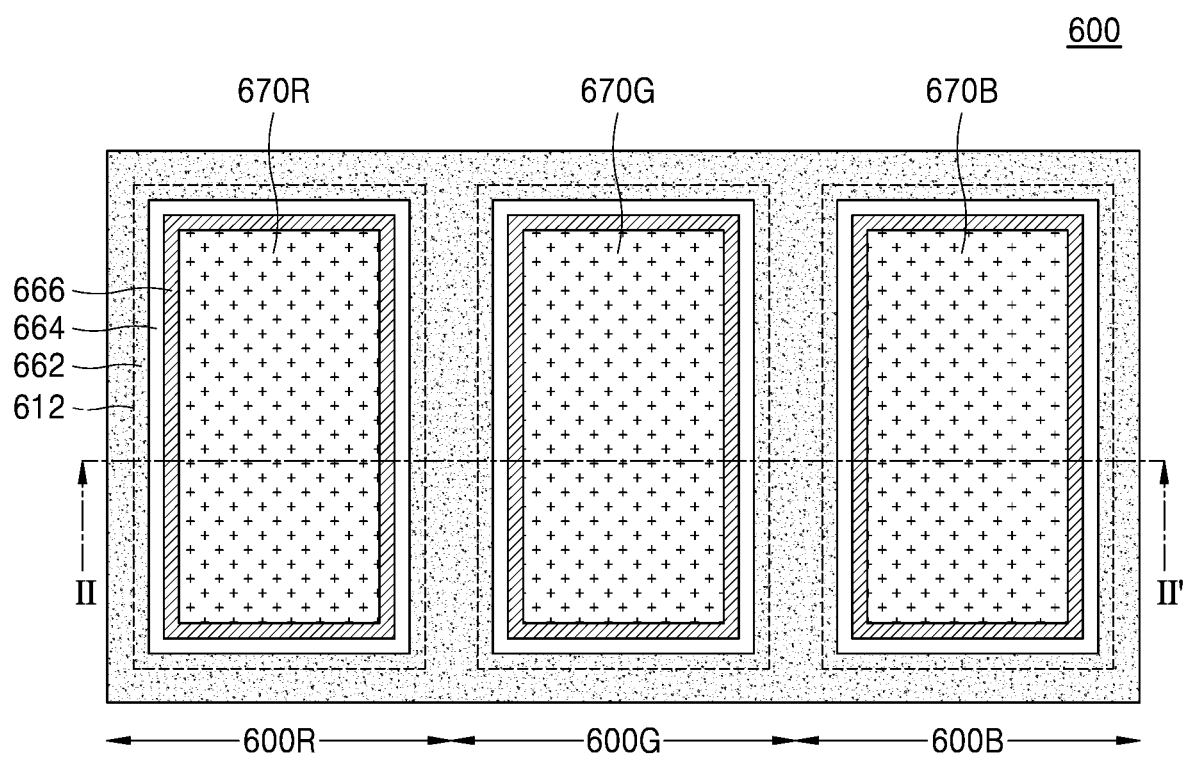
FIG. 14A is a top view of a semiconductor light emitting device according to example embodiments.
Figure 14B:
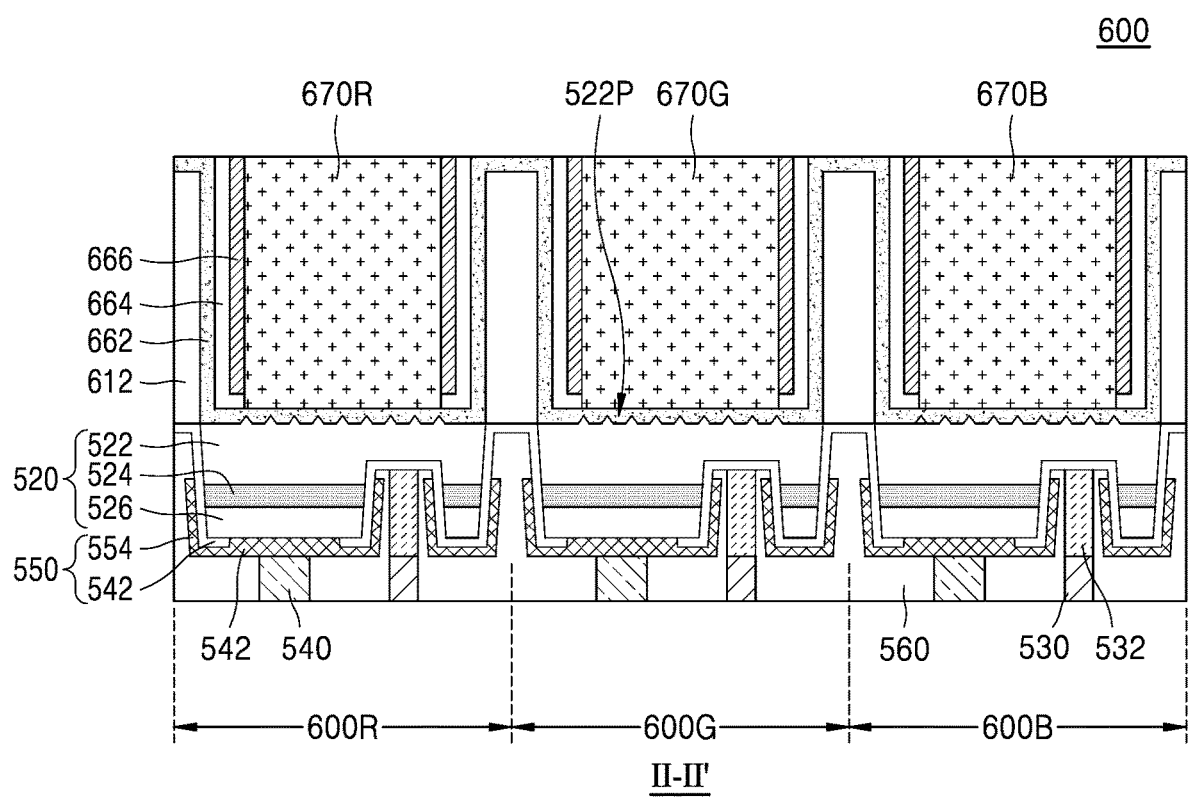
FIG. 14B is a cross-sectional view of the semiconductor light emitting device taken along line II-IF of FIG. 14A.

FIG. 14A is a top view of a semiconductor light emitting device 600 according to example embodiments, and FIG. 14B is a cross-sectional view of the semiconductor light emitting device 600 taken along line II-IF of FIG. 14A. In FIGS. 14A and 14B, the same reference numerals discussed above with reference to FIGS. 1 through 13 denote the same elements.

Referring to FIGS. 14A and 14B, the semiconductor light emitting device 600 includes a first pixel area 600R, a second pixel area 600G, and a third pixel area 600B, and the light emitting structure stack 520 may be arranged in each of the first pixel area 600R, the second pixel area 600G, and the third pixel area 600B. A partition 612 may be arranged in a matrix shape defining a plurality of light emitting regions, and the plurality of light emitting regions and the light emitting structure stack 520 may vertically overlap each other. The partition 612 may be arranged to vertically overlap an area between the adjacent light emitting structure stacks 520. The partition 612 may be a growth substrate for forming the light emitting structure stack 520. After the light emitting structure stack 520 is formed, a portion of the growth substrate may be removed, and the remaining portion of the growth substrate may form the partition 612. An uneven portion 522P may be formed on an upper surface of the first conductive semiconductor layer 522 adjacent to the partition 612 by the removal process, but example embodiments are not limited thereto.

A first passivation layer 662, a reflective layer 664, and a second passivation layer 666 may be sequentially arranged on the partition 612. In some example embodiments, at least one of the first passivation layer 662, the reflective layer 664, and the second passivation layer 666 may be omitted. In some example embodiments, the reflective layer 664 may be a metal layer including Ag, Al, Ni, Cr, Au, Pt, Pd, Sn, W, Rh, Ir, Ru, Mg, Zn, and combinations thereof. In other example embodiments, the reflective layer 664 may be a resin layer such as polyphthalamide (PPA) containing a metal oxide such as titanium oxide or aluminum oxide. In other example embodiments, the reflective layer 664 may be a distributed Bragg reflector layer. For example, the distributed Bragg reflector layer may have a structure in which a plurality of insulating layers having different refractive indices are repeatedly stacked several to hundreds of times. Each of the insulating films included in the distributed Bragg reflective layer may include oxides or nitrides such as $SiO_2$, SiN, $SiO_xN_y$, $TiO_2$, $Si_3N_4$, $Al_2O_3$, TiN, AlN, $ZrO_2$, TiAlN, TiSiN, and combinations thereof.

First to third phosphor layers 670R, 670G, and 670B may be arranged on the second passivation layer 666. The first to third phosphor layers 670R, 670G, and 670B may have a material capable of converting light emitted from the light emitting structure stack 520 arranged in the first to third pixel areas 600R, 600G, and 600B into a desired color. In some example embodiments, the first to third phosphor layers 670R, 670G, and 670B may be a single type of material and may have the same color. In other example embodiments, the first to third phosphor layers 670R, 670G, and 670B may have different colors.

In example embodiments, the first to third phosphor layers 670R, 670G, and 670B may include a resin in which a fluorescent material is distributed or a film containing the fluorescent material, and may include, for example, a phosphor film in which phosphor particles are uniformly distributed at a certain concentration. The phosphor particles may be a wavelength conversion material that converts a wavelength of light emitted from the light emitting structure stack 520. In order to improve the density and color uniformity of the phosphor particles, the first to third phosphor layers 670R, 670G, and 670B may include two or more types of phosphor particles having different size distributions.

In example embodiments, the phosphor may have various compositions and colors such as oxide-based, silicate-based, nitride-based, and fluorite-based compositions. For example, as the phosphor, $\beta$-SiAlON:$Eu^{2+}$ (green), (Ca, Sr)$AlSiN_3$:$Eu^{2+}$ (red), $La_3Si_6N_{11}$:$Ce^{3+}$ (yellow), $K_2SiF_6$:$Mn_4^+$ (red), $SrLiAl_3N_4$:Eu (red), $Ln_{4-x}(Eu_zM_{1-z})_xSi_{12-y}Al_yO_{3+x+y}N_{18-x-y}$ ($0.5 \leq x \leq 3$, $0 < z < 0.3$, and $0 < y \leq 4$) (red), K2TiF6:Mn4+ (red), $NaYF_4$:$Mn_4^+$ (red), $NaGdF_4$:$Mn_4^+$ (red), and the like may be used. However, the type of the phosphor is not limited to the above.

In other example embodiments, a wavelength conversion material such as quantum dots may be further arranged on the first to third phosphor layers 670R, 670G, and 670B. The quantum dot may have a core-shell structure using a III-V or II-VI compound semiconductor, and may have, for example, a core such as CdSe and InP, and a shell such as ZnS and ZnSe. In addition, the quantum dot may include a ligand for stabilizing the core and the shell.

Figure 15:
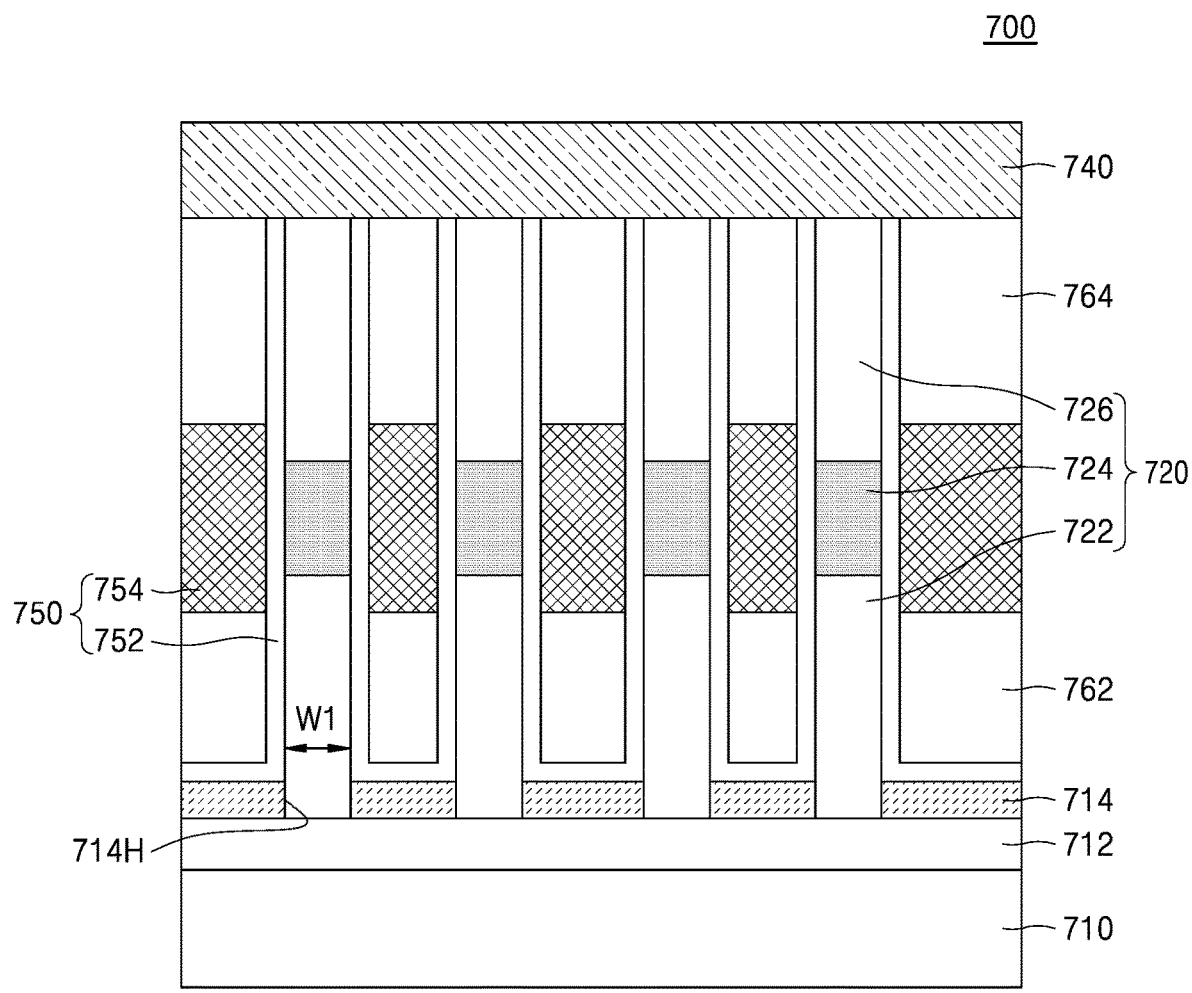
FIG. 15 is a cross-sectional view of a semiconductor light emitting device according to example embodiments.

FIG. 15 is a cross-sectional view of a semiconductor light emitting device 700 according to example embodiments. In FIG. 15, the same reference numerals discussed above with reference to FIGS. 1 to 14B denote the same elements.

Referring to FIG. 15, the semiconductor light emitting device 700 may include a substrate 710, a base layer 712, a plurality of light emitting nanostructures 720, and a field control structure 750.

The base layer 712 may include a first conductive semiconductor material, and may provide a growth surface of the plurality of light emitting nanostructures 720. The base layer 712 may be a nitride semiconductor satisfying $In_xAl_yGa_{1-x-y}N$ ($0 \leq x < 1$, $0 \leq y < 1$, and $0 \leq x+y < 1$), and may be doped with n-type impurities such as Si. For example, the base layer 712 may be n-type GaN.

A mask layer 714 having an opening 714H may be arranged on the base layer 712. A first conductive semiconductor layer 722 may be grown from an upper surface of the base layer 712 exposed by the opening 714H. The mask layer 714 may include an insulating material such as $SiO_2$ or $SiN_x$.

The plurality of light emitting nanostructures 720 may include the first conductive semiconductor layer 722, an active layer 724, and a second conductive semiconductor layer 726 that are sequentially arranged in a first direction perpendicular to an upper surface of the substrate 710. FIG. 15 schematically illustrates that an upper surface of each of the first conductive semiconductor layer 722, the active layer 724, and the second conductive semiconductor layer 726 is substantially parallel to the upper surface of the substrate 710. Alternatively, the upper surface of each of the first conductive semiconductor layer 722, the active layer 724, and the second conductive semiconductor layer 726 may be inclined at a certain angle with respect to the upper surface of the substrate 710. Each of the plurality of light emitting nanostructures 720 may have a first width W1 in a range of about 10 nm to about 500 nm in a direction parallel to the upper surface of the substrate 710. However, the first width W1 of each of the plurality of light emitting nanostructures 720 is not limited thereto.

The field control structure 750 may include a dielectric layer 752 and a field control electrode 754, the dielectric layer 752 may be conformally formed on a sidewall of the plurality of light emitting nanostructures 720 and the mask layer 714, and the field control electrode 754 may be arranged on the dielectric layer 752 to cover a sidewall of the active layer 724. In some examples, a first buried layer 762 may surround a lower sidewall of the plurality of light emitting nanostructures 720 at a lower vertical level than the field control electrode 754, and a second buried layer 764 may surround an upper sidewall of the plurality of light emitting nanostructures 720 at a vertical level higher than the field control electrode 754.

A second electrode 740 electrically connected to the second conductive semiconductor layer 726 may be formed on the second buried layer 764. A first electrode electrically connected to the first conductive semiconductor layer 722 may be further formed on the substrate 710.

In example embodiments, the field control electrode 754 is arranged to be apart from the second electrode 740 and the first electrode, and may be configured to apply a field control voltage independent of an anode voltage or a cathode voltage to a surface area of the active layer 224 arranged adjacent to the dielectric layer 752. However, unlike shown in FIG. 15, the field control electrode 754 may be connected to the second electrode 740, and in this case, when a cathode voltage is applied to the second electrode 740, the field control voltage applied to the field control structure 750 may correspond to the cathode voltage.

FIGS. 16A to 16F are cross-sectional views illustrating a method of manufacturing a semiconductor light emitting device 100B according to example embodiments.

Figure 16A:
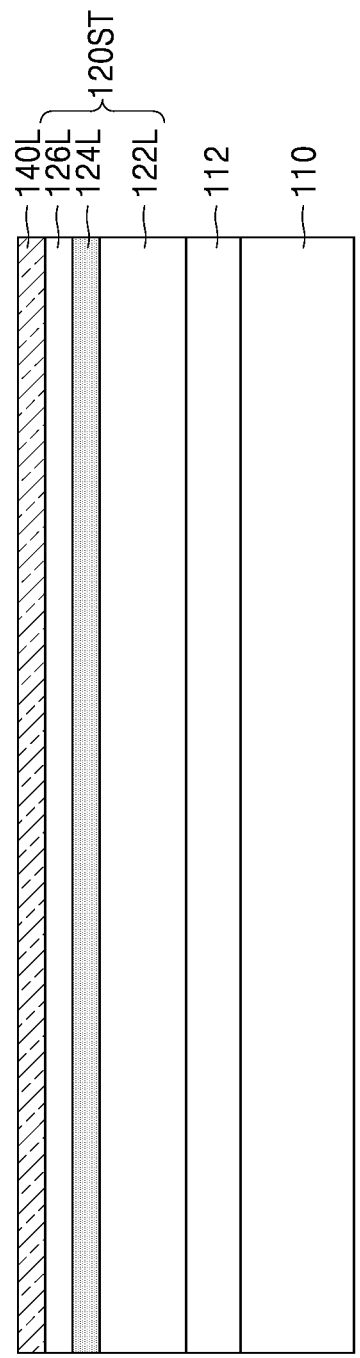
FIGS. 16A to 16F are cross-sectional views illustrating a method of manufacturing a semiconductor light emitting device according to example embodiments.

Referring to FIG. 16A, a buffer layer 112 may be formed on a substrate 110 by an epitaxial growth process, and a preliminary light emitting structure stack 120ST may be formed on the buffer layer 112 by an epitaxial growth process. The preliminary light emitting structure stack 120ST may include a preliminary first conductive semiconductor layer 122L, a preliminary active layer 124L, and a preliminary second conductive semiconductor layer 126L.

Thereafter, a second electrode layer 140L may be formed on the preliminary light emitting structure stack 120ST.

Figure 16B:
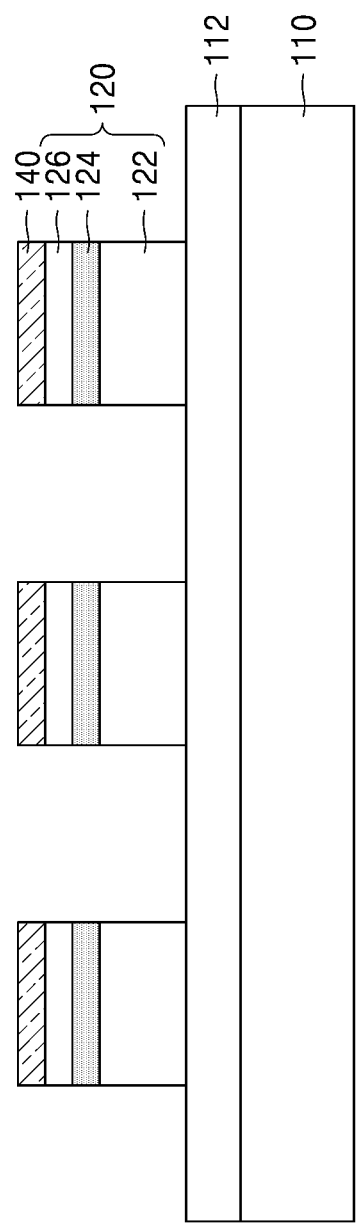

Referring to FIG. 16B, a plurality of light emitting structure stacks 120 and the second electrodes 140 may be formed by forming a mask pattern on the second electrode layer 140L and patterning the preliminary light emitting structure stack 120ST and the second electrode layer 140L. As the plurality of light emitting structure stacks 120 are formed, an upper surface of the buffer layer 112 may be exposed. For example, the patterning process may include a dry etching process or a wet etching process, and in some example embodiments, the patterning process may be a reactive ion etching process.

In some example embodiments, etching may be stopped at a level higher than a bottom surface of the first conductive semiconductor layer 122 in the patterning process, so that an upper surface of the buffer layer 112 may not be exposed.

Figure 16C:
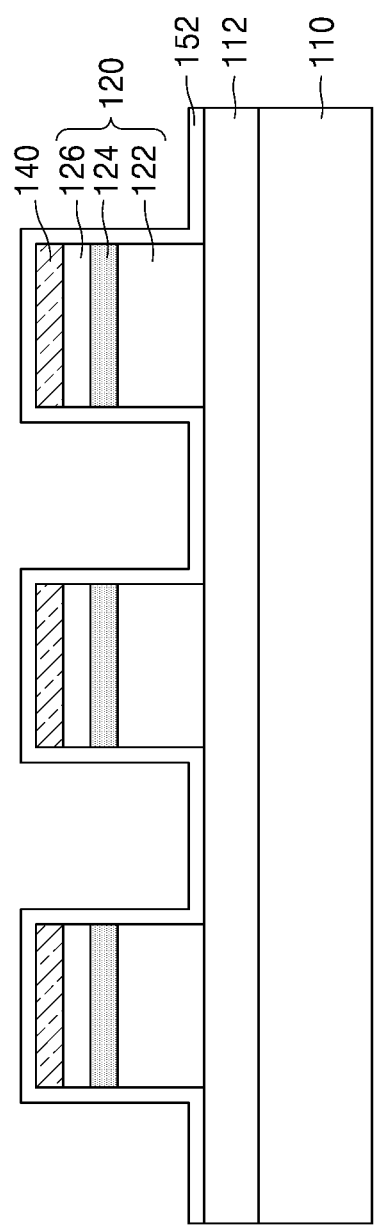

Referring to FIG. 16C, the dielectric layer 152 may be conformally formed on a sidewall of the buffer layer 112 and the light emitting structure stack 120 and on the second electrode 140. In example embodiments, the dielectric layer 152 may include at least one of $SiO_x$, silicon oxynitride, $SiN_x$, magnesium oxide, aluminum oxide, aluminum oxynitride, aluminum gallium oxide, gallium oxide, aluminum nitride, hafnium oxide, and $HfSiO_x$. Optionally, an annealing process or an ion implantation process may be further performed after the process of forming the dielectric layer 152.

Figure 16D:
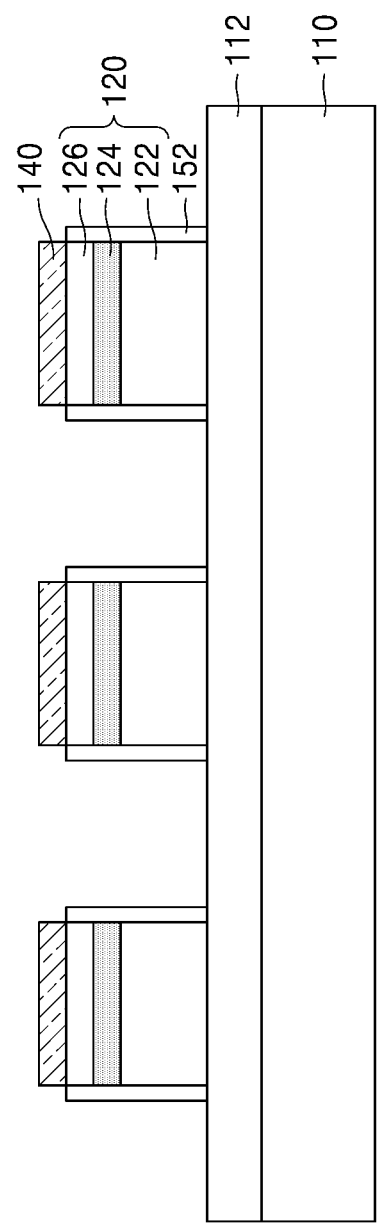

Referring to FIG. 16D, by performing an anisotropic etching process on the dielectric layer 152, the dielectric layer 152 remains on a sidewall of the light emitting structure stack 120, and the upper surface of the buffer layer 112 may be exposed again. The second electrode 140 may also be exposed.

Figure 16E:
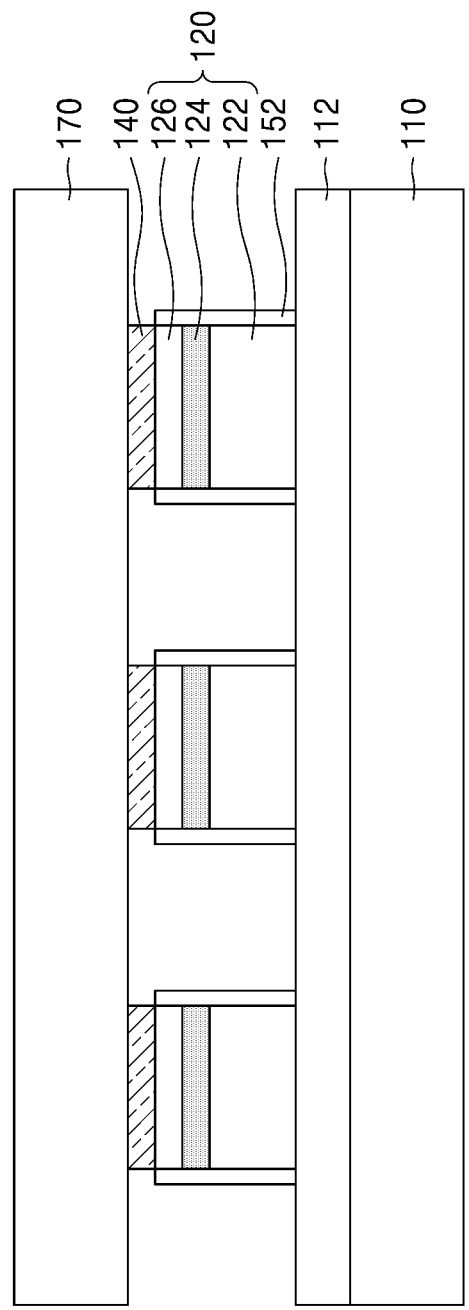

Referring to FIG. 16E, a support substrate 170 may be attached on the second electrode 140. An adhesive layer may be between the support substrate 170 and the second electrode 140.

Figure 16F:
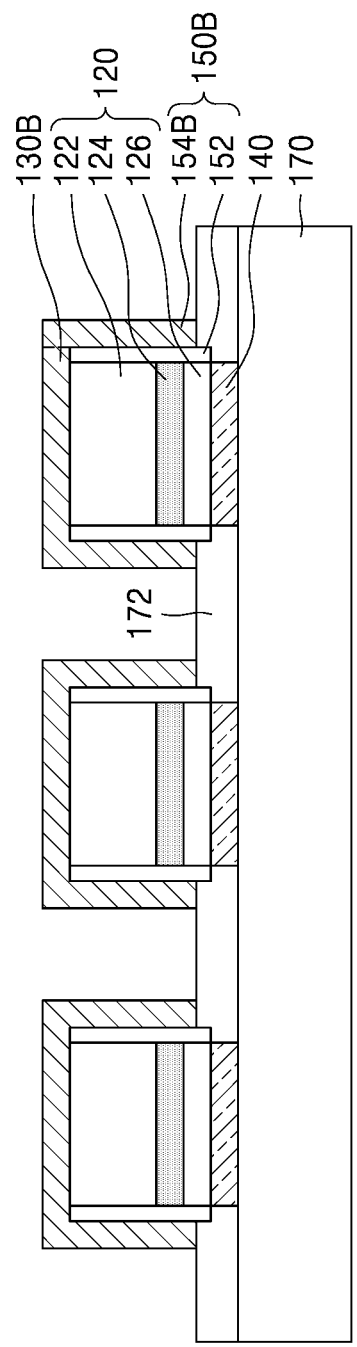

Referring to FIG. 16F, the substrate 110 and the buffer layer 112 may be removed. The removal process of the substrate 110 and the buffer layer 112 may include a grinding process or a laser lift-off process, but is not limited thereto. After the substrate 110 and the buffer layer 112 are removed, the upper surface of the first conductive semiconductor layer 122 may be exposed.

Thereafter, a passivation layer 172 covering the second electrode 140 may be formed on the support substrate 170. The passivation layer 172 may be formed at a height that does not cover a sidewall of the active layer 124.

Thereafter, the first electrode 130B and the field control electrode 154B may be formed on the upper surface and the sidewall of the light emitting structure stack 120 using a conductive material. The first electrode 130B and the field control electrode 154B may be formed using the same material, and the field control electrode 154B and the first electrode 130B may be connected to each other.

The semiconductor light emitting device 100B (see FIG. 3) may be formed by the above-described method.

While aspects of example embodiments have been particularly shown and described, it will be understood that various changes in form and details may be made therein without departing from the spirit and scope of the following claims.

What is claimed is:

1. A semiconductor light emitting device comprising:
a light emitting structure stack comprising a first conductive semiconductor layer, a second conductive semiconductor layer, and an active layer arranged between the first conductive semiconductor layer and the second conductive semiconductor layer;
a first electrode electrically connected to the first conductive semiconductor layer;
a second electrode electrically connected to the second conductive semiconductor layer; and
a field control structure on a sidewall of the light emitting structure stack, the field control structure comprising:
a field control electrode on a sidewall of the active layer; and
a dielectric layer between the field control electrode and the active layer,
wherein the dielectric layer comprises a first dielectric layer and a second dielectric layer sequentially arranged on the sidewall of the active layer,
wherein the second dielectric layer comprises a different material than the first dielectric layer,
wherein at least one from among the first dielectric layer and the second dielectric layer is configured to act as a fixed charge layer,
wherein the first dielectric layer and the second dielectric layer have different total charge densities, and
wherein the field control electrode is configured to cause imbalance between a first carrier concentration and a second carrier concentration by bending an energy band of a portion of the active layer adjacent to an interface between the active layer and the dielectric layer.

2. The semiconductor light emitting device of claim 1, wherein the dielectric layer surrounds and entirely covers a sidewall of the first conductive semiconductor layer, the sidewall of the active layer, and a sidewall of the second conductive semiconductor layer, and
wherein the field control electrode surrounds a portion of the dielectric layer.

3. The semiconductor light emitting device of claim 1, wherein the first conductive semiconductor layer, the active layer, and the second conductive semiconductor layer are sequentially arranged in a first direction perpendicular to an upper surface of the first conductive semiconductor layer,
wherein the first electrode is in contact with the first conductive semiconductor layer on a bottom surface of the light emitting structure stack,
wherein the second electrode is in contact with the second conductive semiconductor layer on an upper surface of the light emitting structure stack, and
wherein the field control electrode is spaced apart from the first electrode and the second electrode on the sidewall of the light emitting structure stack.

4. The semiconductor light emitting device of claim 1, wherein the dielectric layer comprises any one or any combination of silicon oxide ($SiO_x$), silicon oxynitride, silicon nitride ($SiN_x$), magnesium oxide, aluminum oxide, aluminum oxynitride, aluminum gallium oxide, gallium oxide, aluminum nitride, hafnium oxide, and hafnium silicate (HfSiO$_x$).

5. The semiconductor light emitting device of claim 1, wherein a width of the light emitting structure stack in a second direction parallel to an upper surface of the first conductive semiconductor layer is 100 micrometers or less.

6. The semiconductor light emitting device of claim 1, wherein the active layer comprises an n-type semiconductor layer,
wherein the first carrier concentration is a concentration of electrons and the second carrier concentration is a concentration of holes, and
wherein based on a field control voltage being applied to the field control electrode, the second carrier concentration is less than the first carrier concentration.

7. A semiconductor light emitting device comprising:
a light emitting structure stack comprising a first conductive semiconductor layer, a second conductive semiconductor layer, and an active layer arranged between the first conductive semiconductor layer and the second conductive semiconductor layer;
a first electrode on a bottom surface of the first conductive semiconductor layer;
a second electrode on an upper surface of the second conductive semiconductor layer; and
a field control structure on a sidewall of the light emitting structure stack, the field control structure comprising:
a field control electrode on a sidewall of the active layer and a sidewall of the second conductive semiconductor layer, and electrically connected to the second electrode; and
a dielectric layer between the field control electrode and the active layer, and between the field control electrode and the second conductive semiconductor layer,
wherein the dielectric layer comprises a first dielectric layer and a second dielectric layer sequentially arranged on the sidewall of the active layer,
wherein the second dielectric layer comprises a different material than the first dielectric layer,
wherein at least one from among the first dielectric layer and the second dielectric layer is configured to act as a fixed charge layer,
wherein the first dielectric layer and the second dielectric layer have different total charge densities, and
wherein the field control electrode is configured to cause imbalance between a first carrier concentration and a second carrier concentration by bending an energy band of a portion of the active layer adjacent to an interface between the active layer and the dielectric layer.

8. The semiconductor light emitting device of claim 7, wherein the dielectric layer surrounds a sidewall of the first conductive semiconductor layer, the sidewall of the active layer, and the sidewall of the second conductive semiconductor layer.

9. The semiconductor light emitting device of claim 7, wherein the field control electrode is electrically isolated from the second electrode.

10. The semiconductor light emitting device of claim 7, wherein a bottom surface of the field control electrode is arranged at a lower level than a bottom surface of the active layer based on the bottom surface of the first conductive semiconductor layer.

11. A semiconductor light emitting device comprising:
a light emitting structure stack comprising a first conductive semiconductor layer, a second conductive semiconductor layer, and an active layer arranged between the first conductive semiconductor layer and the second conductive semiconductor layer;
a first electrode on a bottom surface of the first conductive semiconductor layer;
a second electrode on an upper surface of the second conductive semiconductor layer; and
a field control structure surrounding a sidewall of the light emitting structure stack, the field control structure comprising:
a dielectric layer on the sidewall of the light emitting structure stack; and
a field control electrode surrounding a sidewall of the active layer, wherein the dielectric layer is between the active layer and the field control electrode and is spaced apart from the first electrode and the second electrode,
wherein the dielectric layer comprises a first dielectric layer and a second dielectric layer sequentially arranged on the sidewall of the active layer,
wherein the second dielectric layer comprises a different material than the first dielectric layer,
wherein at least one from among the first dielectric layer and the second dielectric layer is configured to act as a fixed charge layer,
wherein the first dielectric layer and the second dielectric layer have different total charge densities,
wherein the semiconductor light emitting device is configured to apply a field control voltage to the field control electrode, the field control voltage being independent of a cathode voltage applied to the first electrode or an anode voltage applied to the second electrode, and
wherein based on the field control voltage being applied to the field control electrode, the field control electrode is configured to cause imbalance between a first carrier concentration and a second carrier concentration by bending an energy band of a portion of the active layer adjacent to an interface between the active layer and the dielectric layer.

12. The semiconductor light emitting device of claim 11, wherein one from among the first dielectric layer and the second dielectric layer comprises any one or any combination of silicon oxide (SiO$_x$), silicon oxynitride, silicon nitride (SiN$_x$), magnesium oxide, aluminum oxide, aluminum oxynitride, aluminum gallium oxide, gallium oxide, aluminum nitride, hafnium oxide, and hafnium silicate (HfSiO$_x$).

13. The semiconductor light emitting device of claim 1, wherein the first dielectric layer has a first thickness and the second dielectric layer has a second thickness, and
wherein each of the first thickness and the second thickness is within a range of about 10 nm to about 500 nm.

* * * * *